US011161996B2

(12) United States Patent
Liu et al.

(10) Patent No.: US 11,161,996 B2
(45) Date of Patent: Nov. 2, 2021

(54) PRINTED ELECTRONICS

(71) Applicants: GGI INTERNATIONAL, Montreal (CA); NATIONAL RESEARCH COUNCIL OF CANADA, Ottawa (CA); HER MAJESTY THE QUEEN IN RIGHT OF CANADA (...), Ottawa (CA)

(72) Inventors: Xiangyang Liu, Nepean (CA); Olga Mozenson, Ottawa (CA); Bhavana Deore, Ottawa (CA); Chantal Paquet, Ottawa (CA); Arnold Kell, Ottawa (CA); Patrick Malenfant, Orleans (CA); Julie Ferrigno, Montreal (CA); Olivier Ferrand, Montreal (CA); Jian Xiong Hu, Saint-Laurent (CA); Sylvie Lafreniere, Montreal (CA); Reza Chaharmir, Kanata (CA); Jonathan Ethier, Carlsbad Springs (CA); Khelifa Hettak, Ottawa (CA); Jafar Shaker, Ottawa (CA); Adrian Momciu, Ottawa (CA)

(73) Assignees: E2IP TECHNOLOGIES INC., Montreal (CA); NATIONAL RESEARCH COUNCIL OF CANADA, Ottawa (CA); HER MAJESTY THE QUEEN IN RIGHT OF CANADA (...), Ottawa (CA)

( * ) Notice: Subject to any disclaimer, the term of this patent is extended or adjusted under 35 U.S.C. 154(b) by 0 days.

(21) Appl. No.: 16/345,089

(22) PCT Filed: Oct. 25, 2017

(86) PCT No.: PCT/CA2017/051272
§ 371 (c)(1),
(2) Date: Apr. 25, 2019

(87) PCT Pub. No.: WO2018/076110
PCT Pub. Date: May 3, 2018

(65) Prior Publication Data
US 2019/0284422 A1   Sep. 19, 2019

Related U.S. Application Data

(60) Provisional application No. 62/412,536, filed on Oct. 25, 2016.

(51) Int. Cl.
*C09D 11/52* (2014.01)
*H01M 10/615* (2014.01)
(Continued)

(52) U.S. Cl.
CPC .............. *C09D 11/52* (2013.01); *B64D 15/12* (2013.01); *C09D 11/037* (2013.01); *C09D 11/10* (2013.01);
(Continued)

(58) Field of Classification Search
CPC ....... C09D 11/52; C09D 11/037; C09D 11/10; H05K 1/16; H05K 1/0283; H05K 1/095;
(Continued)

(56) References Cited

U.S. PATENT DOCUMENTS

| | | |
|---|---|---|
| 6,036,889 A | 3/2000 | Kydd |
| 9,078,360 B2 | 7/2015 | Cok |

(Continued)

FOREIGN PATENT DOCUMENTS

| | | |
|---|---|---|
| JP | 2008117790 A | 5/2008 |
| JP | 2011192947 A | 9/2011 |

(Continued)

OTHER PUBLICATIONS

Critzer, M.S., "Advanced in Printed Electronic Materials that Meet Cost and Performance Needs", Jan. 7, 2014.

*Primary Examiner* — Alexander Eisen

*Assistant Examiner* — Kebede T Teshome
(74) *Attorney, Agent, or Firm* — France Cote

(57) ABSTRACT

The present invention relates to an electronic device comprising a printed substrate comprising a trace of molecular ink thereon, the molecular ink being sintered to form a conductive metal trace forming the electronic device, wherein the molecular ink is chosen from a) a flake-less printable composition of 30-60 wt % of a $C_8$-$C_{12}$ silver carboxylate, 0.1-10 wt % of a polymeric binder and balance of at least one organic solvent, all weights based on total weight of the composition; or b) a flake-less printable composition of 5-75 wt % of bis(2-ethyl-1-hexylamine) copper (II) formate, bis(octylamine) copper (II) formate or tris(octylamine) copper (II) formate, 0.25-10 wt % of a polymeric binder and balance of at least one organic solvent, all weights based on total weight of the composition.

19 Claims, 24 Drawing Sheets

(51) Int. Cl.
| | |
|---|---|
| *H01M 10/625* | (2014.01) |
| *B64D 15/12* | (2006.01) |
| *C09D 11/037* | (2014.01) |
| *C09D 11/10* | (2014.01) |
| *H01L 23/498* | (2006.01) |
| *H01L 31/0224* | (2006.01) |
| *H01M 10/052* | (2010.01) |
| *H05B 3/26* | (2006.01) |
| *H05B 33/06* | (2006.01) |
| *H05K 1/02* | (2006.01) |
| *H05K 1/09* | (2006.01) |
| *H05K 1/16* | (2006.01) |
| *G06F 3/044* | (2006.01) |
| *G06F 3/045* | (2006.01) |

(52) U.S. Cl.
CPC .... *H01L 23/4985* (2013.01); *H01L 23/49883* (2013.01); *H01L 31/022466* (2013.01); *H01M 10/052* (2013.01); *H01M 10/615* (2015.04); *H01M 10/625* (2015.04); *H05B 3/26* (2013.01); *H05B 33/06* (2013.01); *H05K 1/0283* (2013.01); *H05K 1/095* (2013.01); *H05K 1/16* (2013.01); *H05K 1/162* (2013.01); *H05K 1/165* (2013.01); *G06F 3/045* (2013.01); *G06F 3/0443* (2019.05); *G06F 3/0446* (2019.05); *G06F 2203/04102* (2013.01); *H01M 2220/20* (2013.01); *H05K 2201/10113* (2013.01); *H05K 2201/10143* (2013.01); *H05K 2201/10151* (2013.01)

(58) Field of Classification Search
CPC ............... H05K 1/162; H05K 1/165; H05K 2201/10113; H05K 2201/10143; H05K 2201/10151; H01M 10/615; H01M 10/625; H01M 10/052; H01M 2220/20; B64D 15/12; H01L 23/4985; H01L 23/49883; H01L 31/022466; H05B 3/26; H05B 33/06; G06F 3/0446; G06F 3/0443; G06F 3/045; G06F 2203/04102
See application file for complete search history.

(56) References Cited

U.S. PATENT DOCUMENTS

| | | |
|---|---|---|
| 2002/0011786 A1 | 1/2002 | Murasko et al. |
| 2007/0154644 A1* | 7/2007 | Hwang ................ C09D 11/102 427/383.1 |
| 2014/0349025 A1* | 11/2014 | Hui .......................... C08K 3/08 427/492 |
| 2016/0137865 A1 | 5/2016 | Kwon et al. |
| 2016/0144690 A1 | 5/2016 | Wittkowski et al. |
| 2017/0298242 A1* | 10/2017 | Mostowy-Gallagher .................... H01B 1/22 |

FOREIGN PATENT DOCUMENTS

| | | |
|---|---|---|
| JP | 5859075 B1 | 2/2016 |
| WO | 2008085550 A2 | 7/2008 |
| WO | 2014013899 A1 | 1/2014 |
| WO | 2014013899 A1 | 1/2014 |
| WO | 2015111715 A1 | 7/2015 |
| WO | 2015192248 A1 | 12/2015 |
| WO | 2016060838 A1 | 4/2016 |
| WO | 2016163695 A1 | 10/2016 |

* cited by examiner

IPC Shear Force Test (No encapsulation on LED)

| | Flake Ink on PET (lbs) | Molecular Ink Photosintered on PET (lbs) | Flake Ink on Polyimide (lbs) | Molecular Ink Thermosintered on Polyimide (lbs) | Molecular Ink Photosintered on Polyimide (lbs) |
|---|---|---|---|---|---|
| LED 1 | 1.90 | 3.70 | 3.85 | 5.30 | 4.95 |
| LED 2 | 2.20 | 3.60 | 3.65 | 4.80 | 4.10 |
| LED 3 | 1.85 | 4.60 | 3.85 | 4.30 | 4.05 |
| LED 4 | 2.40 | - | 3.55 | 4.75 | 4.90 |
| LED 5 | - | - | - | - | 5.15 |
| Minimum | 1.85 | 3.60 | 3.55 | 4.30 | 4.05 |
| Average | 2.09 | 3.97 | 3.73 | 4.70 | 4.63 |
| Maximum | 2.40 | 4.60 | 3.85 | 5.30 | 5.15 |

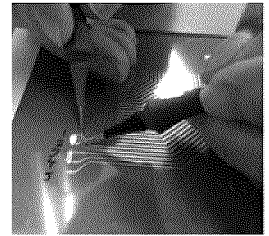

Adhesive force is higher on Molecular Silver ink

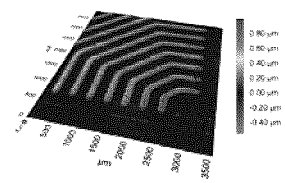

Silver Migration (ASTM F1996-01 Silver migration test)
- 5 and 10 mil traces held at 40°C/95% RH for 10 days, 20V DC
- No migration

FIGURE 4

Metal-Insulator-Metal (MIM Devices)

FIGURE 5A

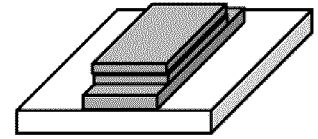

inductor capacitor

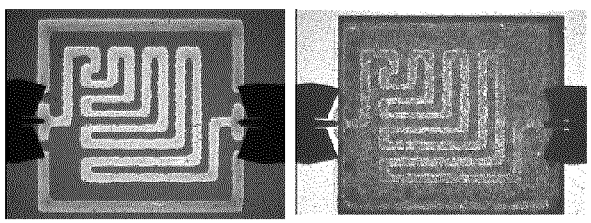

| Molecular ink Print Location | Inductance (nH) ($f_0$ = 200MHz) |
|---|---|
| Substrate | 7.5 ± 0.2 |
| Dielectric | 8.4 ± 0.3 |

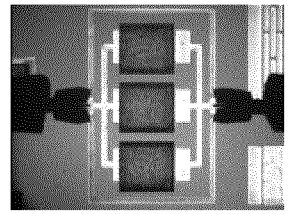

| Capacitance(pF) ($f_0$ = 200MHz) |
|---|
| 15.9 ± 1.7 |

FIGURE 12A
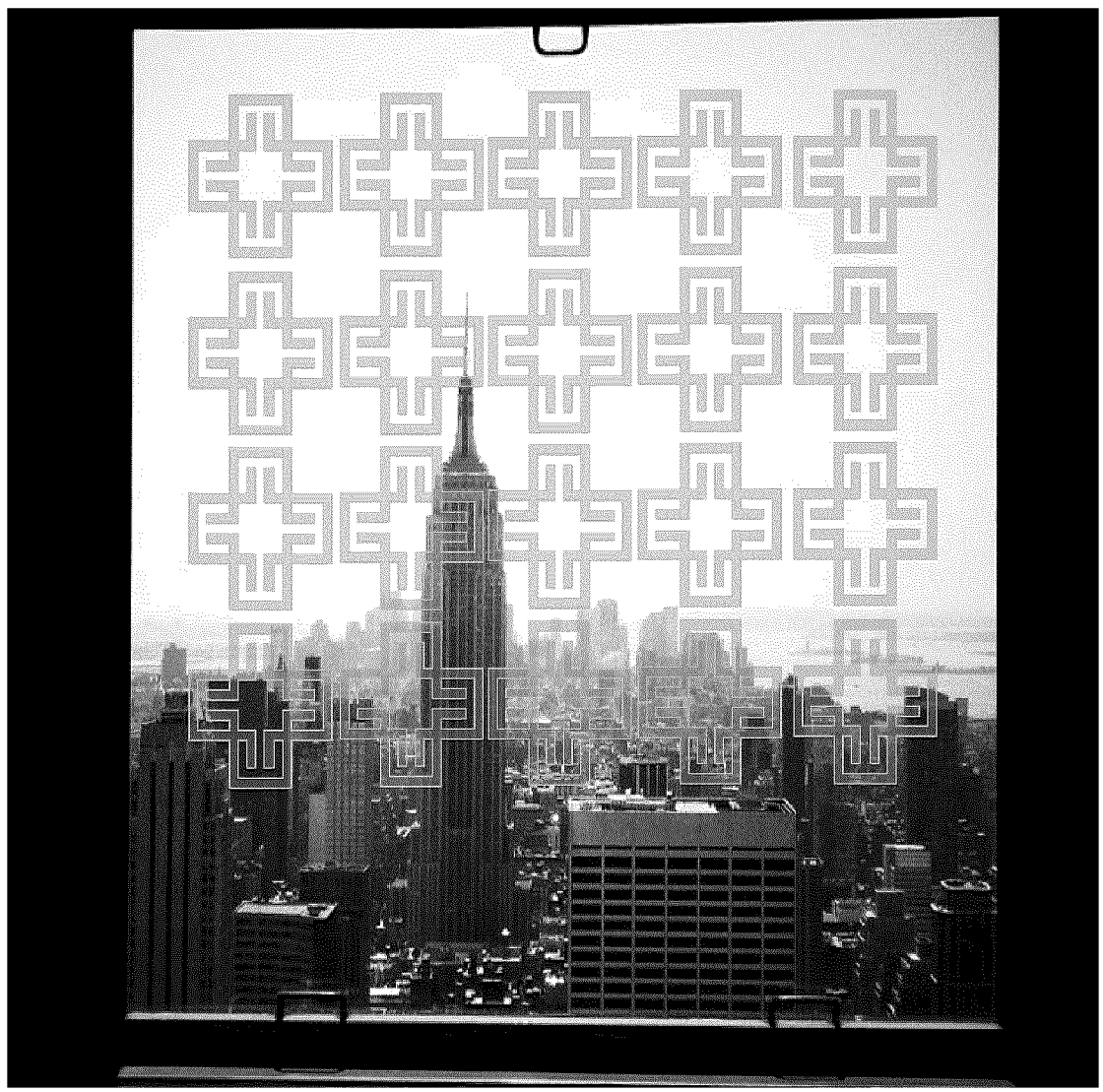
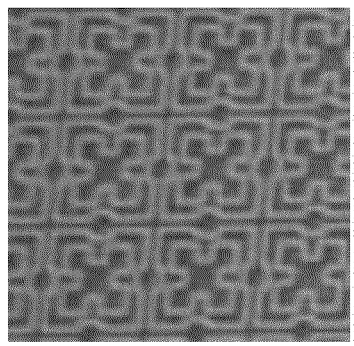
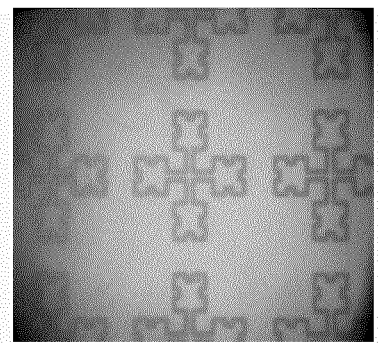
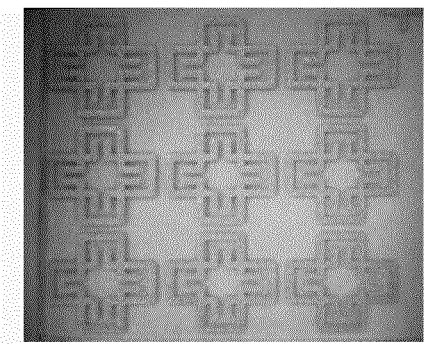
FIGURE 12B     FIGURE 12C     FIGURE 12D

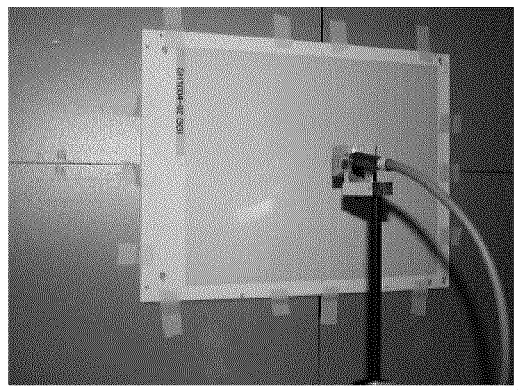
FIGURE 13A
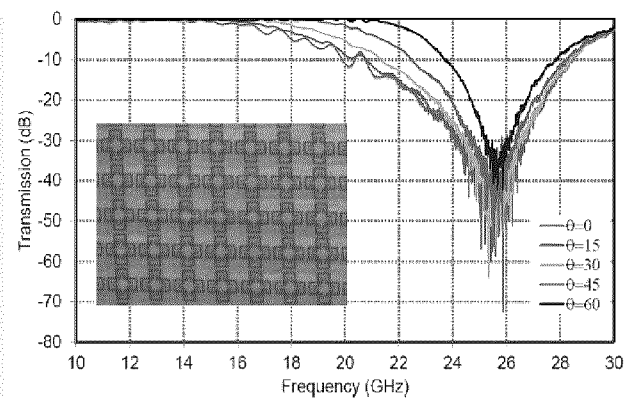
FIGURE 13B
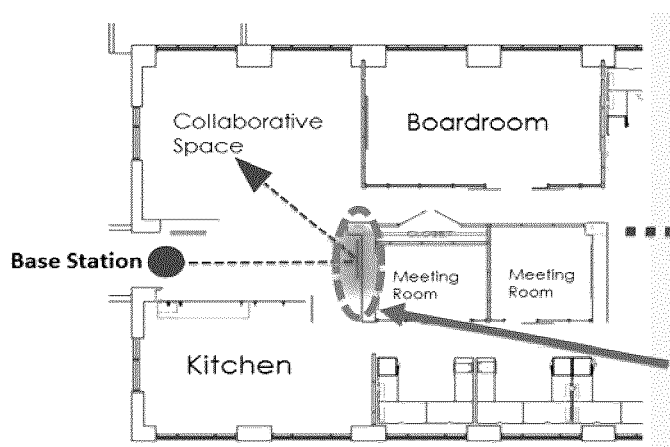
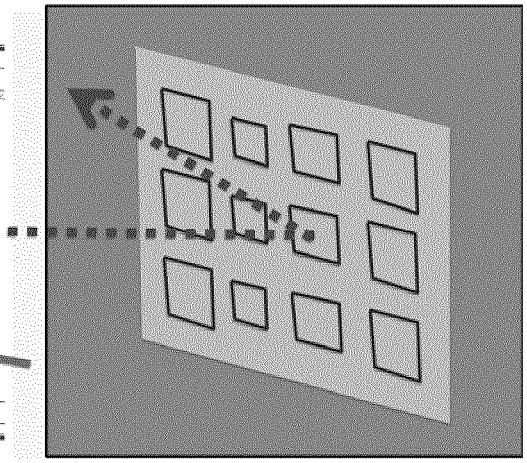
FIGURE 14

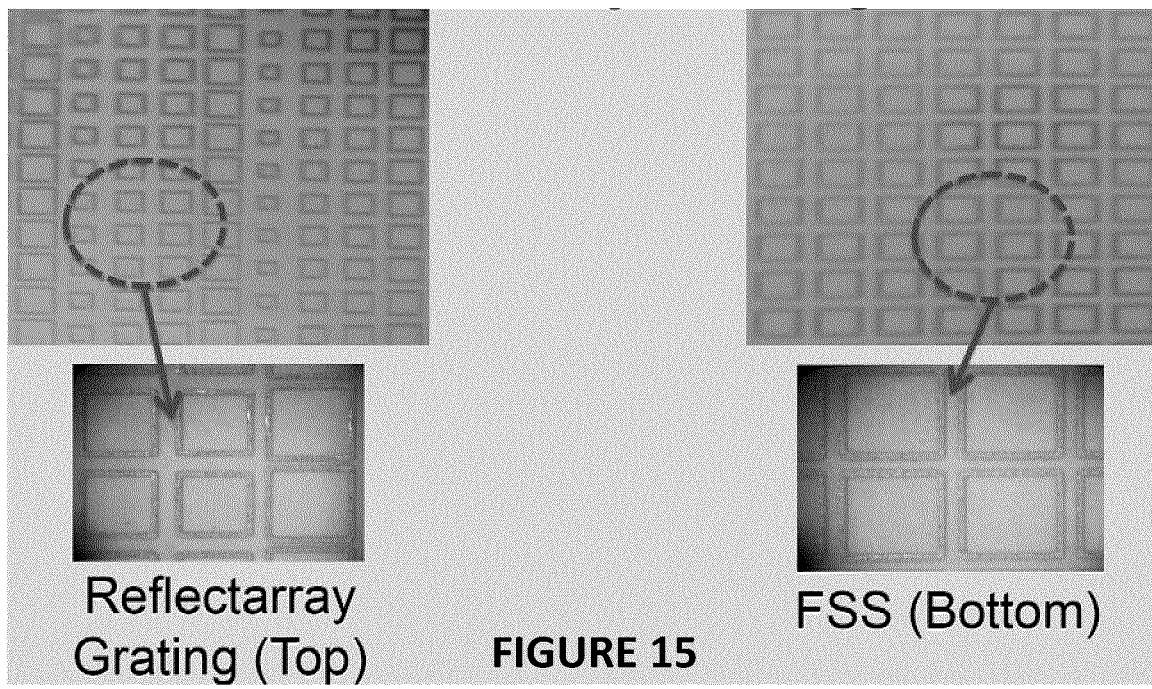
FIGURE 15
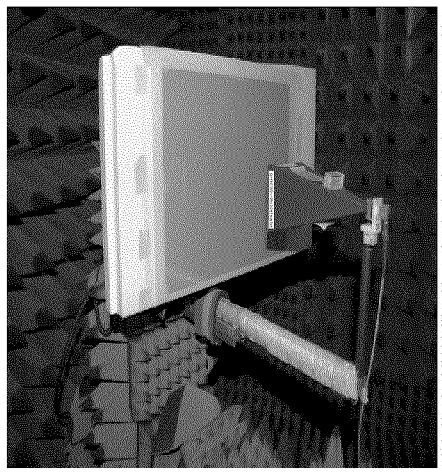
FIGURE 16A
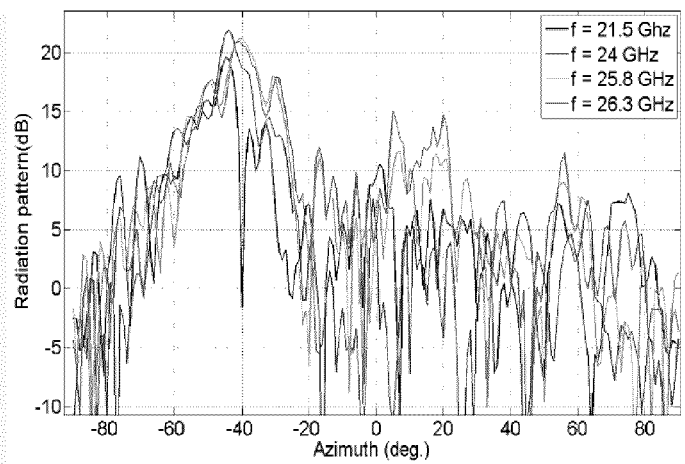
FIGURE 16B
FIGURE 17A
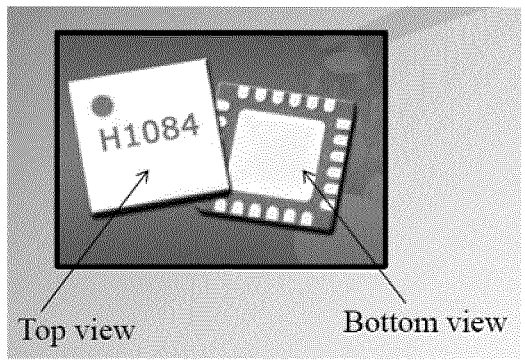

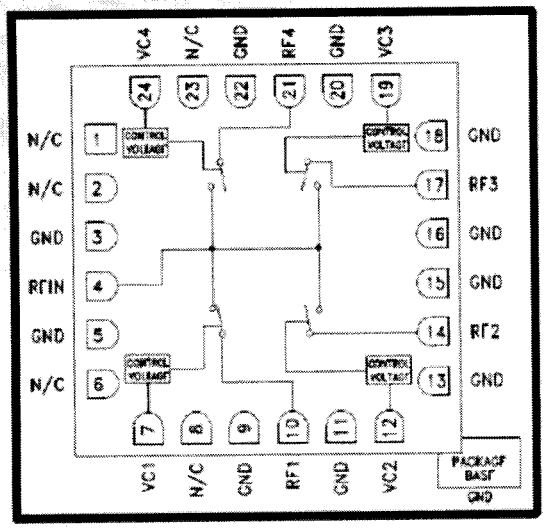
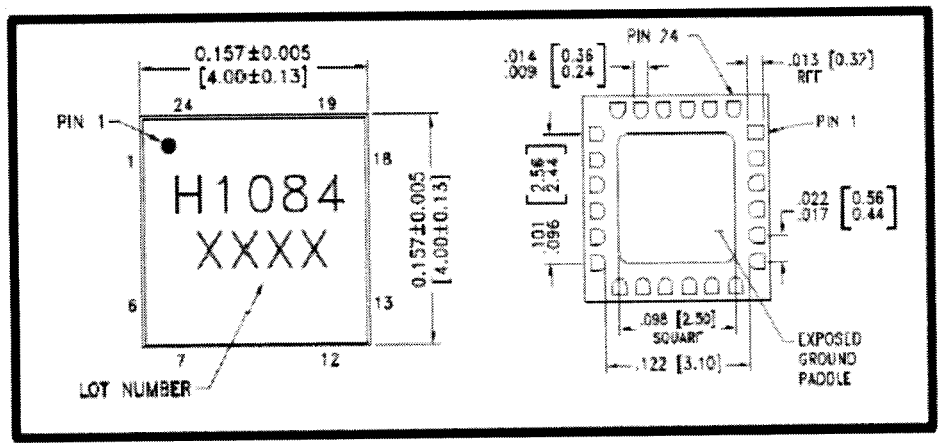
FIGURE 17B

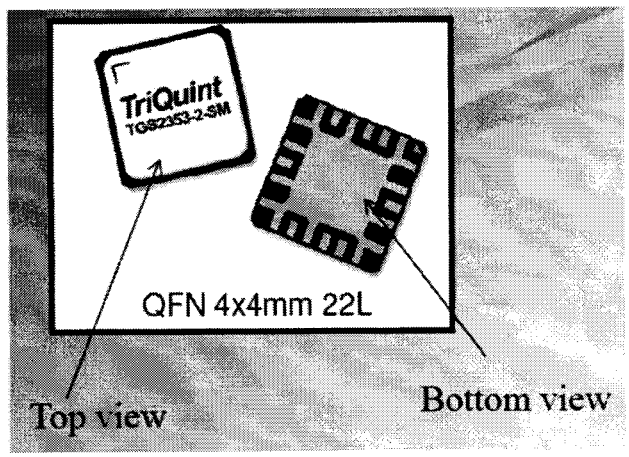
FIGURE 18A
Functional Diagram
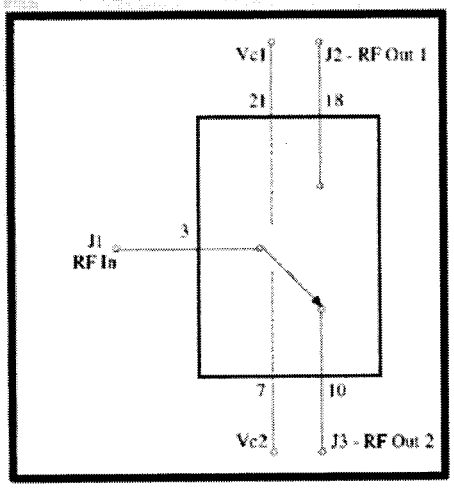
Outline Drawing
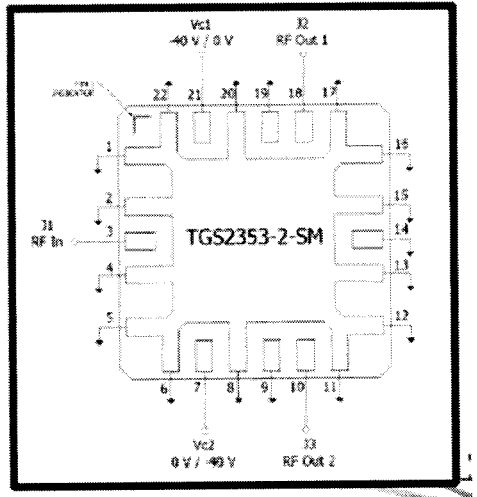
FIGURE 18B

Flexible Substrate (Kapton) Motherboard

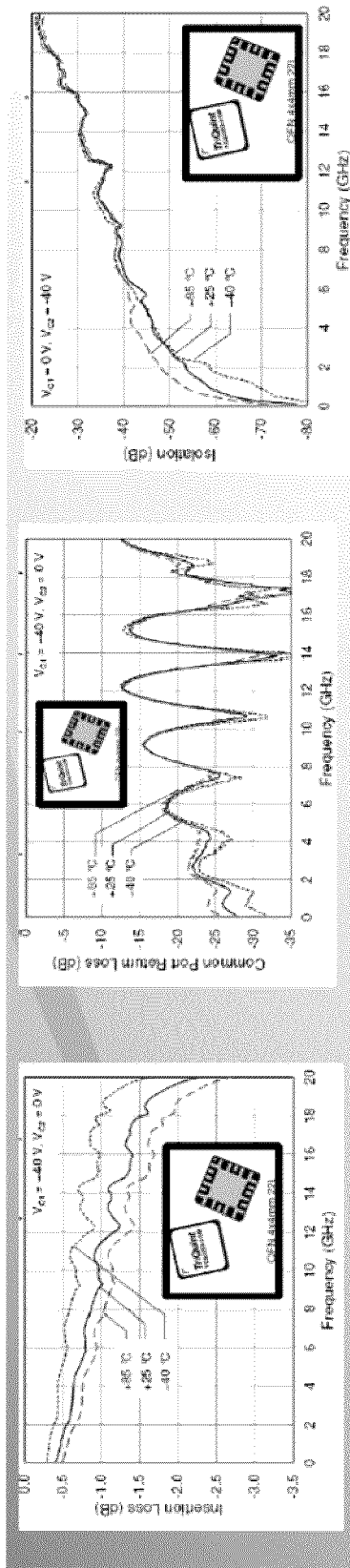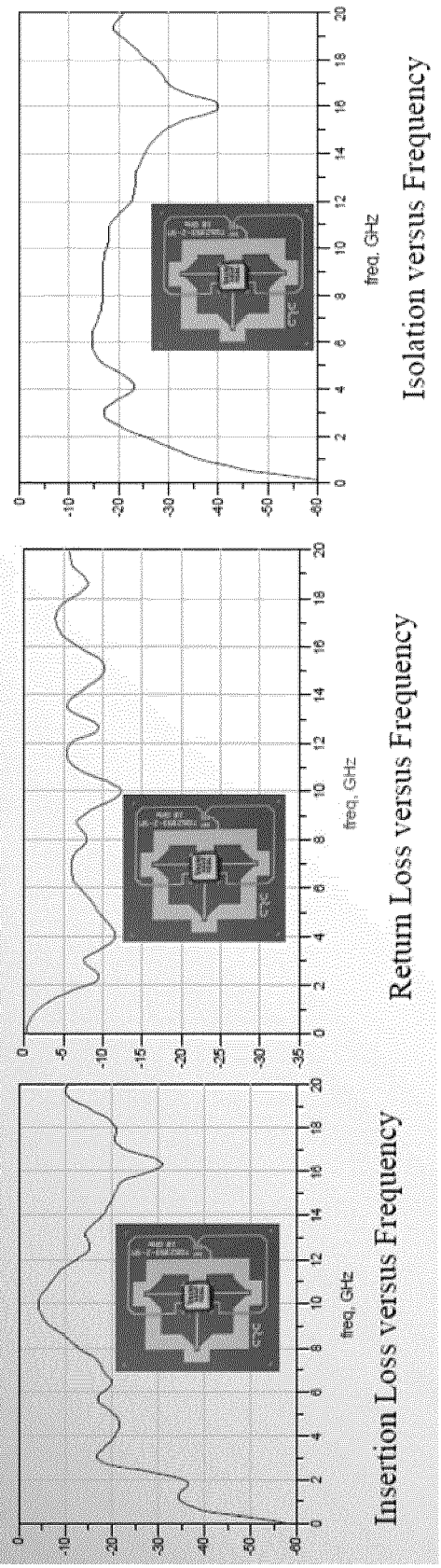
FIGURE 23

FIGURE 25A
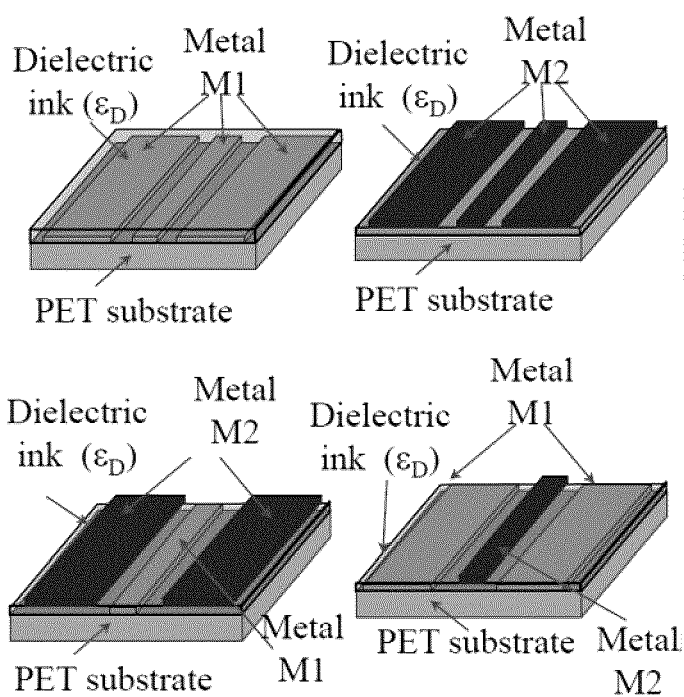
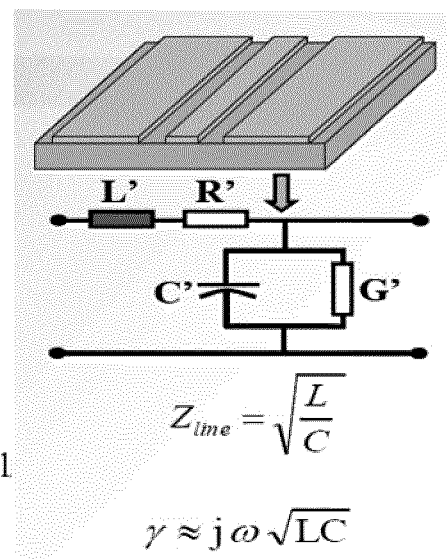
FIGURE 25B
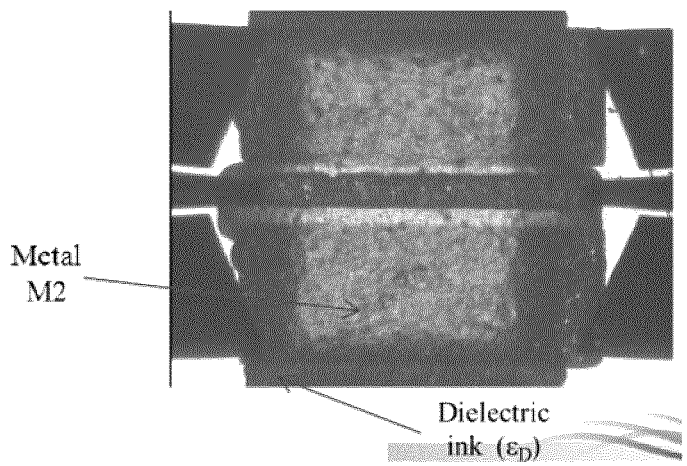

FIGURE 26A
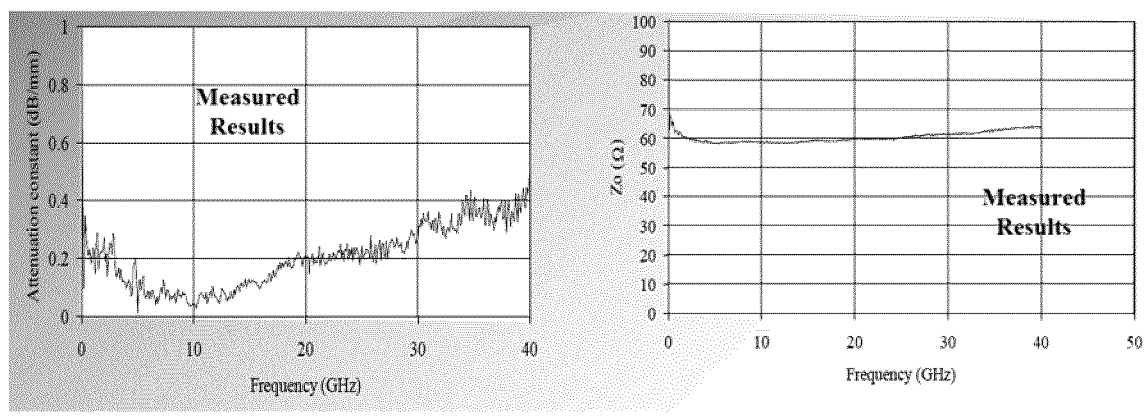
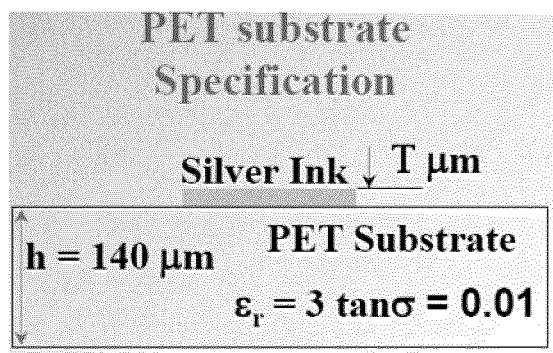
FIGURE 26B

FIGURE 27
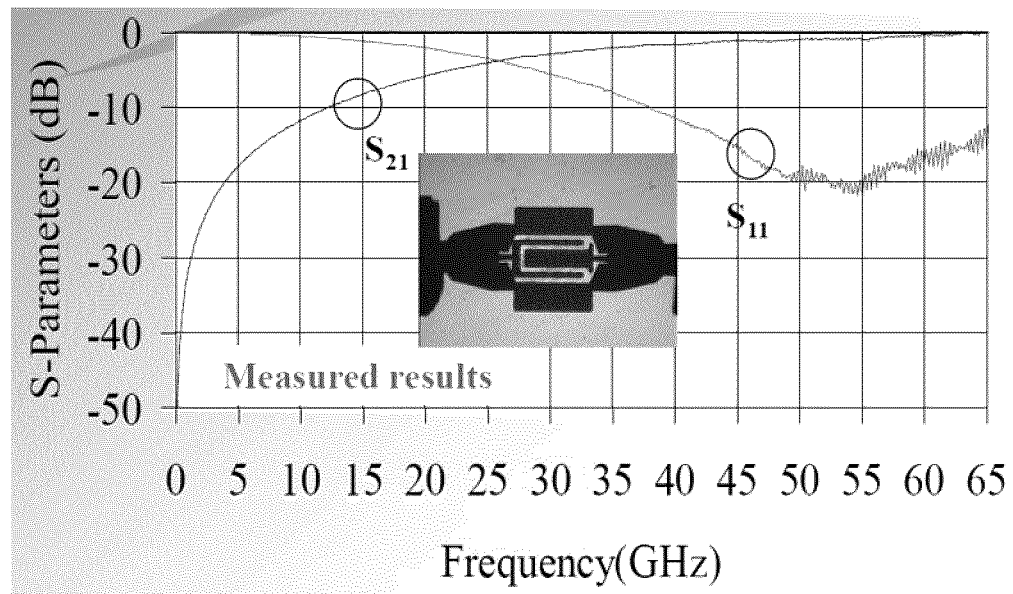
FIGURE 28A
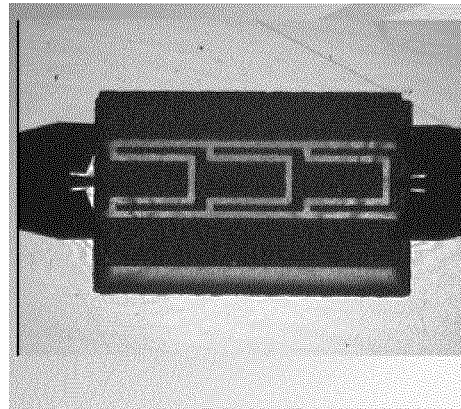
FIGURE 28B
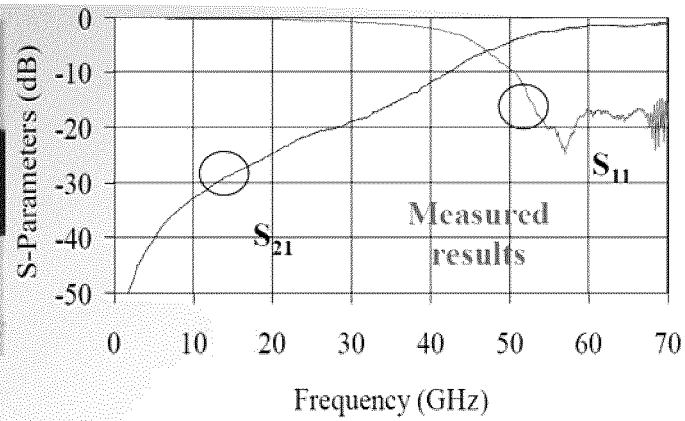
FIGURE 29
Traces Ag w= 1,0 -1,4 mils (25-35 uM)
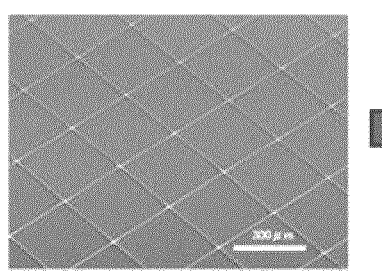 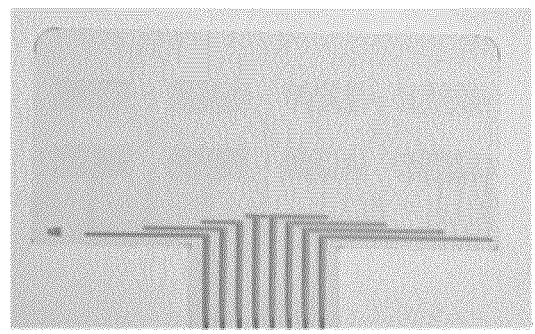
Micro-wires Touch interface

| Geometry | Side view of template | Top view of template | Angle (° off of vertical) | Strain Average (%) | Strain Maximum (%) |
|---|---|---|---|---|---|
| Oval |  |  | - | 15±1 | 30 |
| Dome |  |  | - | 16±6 | 26 |
| Rectangular prism |  |  | 75 | 40±16 | 75 |
| Rectangular prism |  |  | 65 | 37±14 | 60 |
| Rectangular prism |  |  | 55 | 23±10 | 30 |
| Crater (ouside) |  |  | 75 | 32±12 | 50 |
| Crater (inside) |  |  | 75 | 39±13 | 50 |
| Crater (outside) |  |  | 65 | 28±12 | 40 |
| Crater (inside) |  |  | 65 | 38±9 | 50 |
| Crater (outside) |  |  | 55 | 23±8 | 30 |
| Crater (inside) |  |  | 55 | 36±10 | 50 |
FIGURE 30

| Geometry | Side view of temp- late | Top view of temp- late | Angle (° off of vertical) | Relative resistance ($R_{formed}/R_{unformed}$) | | | | |
|---|---|---|---|---|---|---|---|---|
| | | | | Line width (μm) | | | | |
| | | | | 551±22 | 469±19 | 358±14 | 215±8 | 164±6 |
| Oval | | | - | 1.4±0.1 | 1.3±0.2 | 1.0±0.1 | 0.8±0.1 | 1.3±0.1 |
| Dome | | | - | 1.1±0.1 | 1.2±0.1 | 1.2±0.1 | 1.2±0.2 | 1.3±0.1 |
| Rectangular prism | | | 75 | 1.3±0.2 | 1.3±0.1 | 1.2±0.1 | 1.0±0.1 | 1.4±0.2 |
| Rectangular prism | | | 65 | 1.1±0.1 | 1.1±0.1 | 1.1±0.1 | 1.0±0.1 | 1.3±0.1 |
| Rectangular prism | | | 55 | 1.2±0.1 | 1.3±0.1 | 1.1±0.1 | 1.0±0.1 | 1.4±0.5 |
| Crater | | | 75 | 1.5±0.2 | 1.8±0.1 | 2.0±0.9 | 1.8±0.6 | 2.6±0.5 |
| Crater | | | 75 | 1.5±0.2 | 1.6±0.1 | 1.5±0.1 | 1.8±0.2 | 2.8±0.4 |
| Crater | | | 65 | 1.4±0.1 | 1.5±0.1 | 1.5±0.2 | 1.7±0.3 | 2.3±0.1 |

FIGURE 31

PRINTED ELECTRONICS

BACKGROUND

(a) Field

The subject matter disclosed generally relates to printed electronics. More specifically, it relates to printed electronics applications using molecular ink or flake ink.

(b) Related Prior Art

There are inks, such as molecular inks or flake inks, designed to give specific properties to the inks being printed.

The advent of printable inks with new properties brings possibilities to rethink the use of electrical conducting surfaces.

SUMMARY

According to an embodiment, there is provided an electronic device comprising a printed substrate comprising a trace of molecular ink thereon, the molecular ink being sintered to form a conductive metal trace forming the electronic device, in which the molecular ink is chosen from a flake-less printable composition of 30-60 wt % of a $C_8$-$C_{12}$ silver carboxylate, 0.1-10 wt % of a polymeric binder and balance of at least one organic solvent, all weights based on total weight of the composition or a flake-less printable composition of 5-75 wt % of bis(2-ethyl-1-hexylamine) copper (II) formate, bis(octylamine) copper (II) formate or tris(octylamine) copper (II) formate, 0.25-10 wt % of a polymeric binder and balance of at least one organic solvent, all weights based on total weight of the composition.

There is provided an electronic device in which the molecular ink is stretchable and thermoformable.

There is provided an electronic device in which the substrate is flexible.

There is provided an electronic device which is printed as an electronic component.

There is provided an electronic device which is printed as a metal-insulator-metal (MIM) device.

There is provided an electronic device in which the trace of ink is on the insulator of the electronic device.

There is provided an electronic device which comprises an inductor.

There is provided an electronic device which comprises a capacitor.

There is provided an electronic device which comprises an electronic filter.

There is provided an electronic device which is printed as a solderable printed circuit board.

There is provided an electronic device which is printed as one of: a coplanar waveguide, an ultra high-frequency RF antenna, an ultra high-frequency RF filter and a hybrid RF device.

There is provided an electronic device which is printed as an engineered surface for frequency-selective RF filtering, reflecting or orienting.

There is provided an electronic device which is printed as a solar cell.

There is provided an electronic device which is printed as a semiconductor device.

There is provided an electronic device which is printed as a transparent electrode.

There is provided an electronic device which is printed as an electroluminescent lamp.

There is provided an electronic device which is printed as a wearable electronic device or an in-mold electronic device.

There is provided an electronic device which is printed as one of a physicochemical and an electromechanical sensor.

According to a second embodiment, there is provided a heater comprising an electronic device comprising a printed substrate with a trace of ink thereon, the ink being sintered to form a conductive metal trace forming the electronic device, in which the ink is chosen from a molecular ink or a flake ink.

There is provided an electronic device in which the molecular ink is stretchable and thermoformable.

There is provided an electronic device in which the substrate is flexible.

There is provided an electronic device which is printed as a resistive electrical circuit.

There is provided an electronic device which is coated in a portion of an aircraft.

There is provided an electronic device which is installed in a wing of an aircraft to heat the wing.

There is provided an electronic device which is used to maintain the performance of aircrafts, emergency systems, electric vehicles, lighting systems or building automation system.

There is provided an electronic device which is installed on a battery to heat the battery.

There is provided an electronic device in which the battery is a lithium battery.

According to a third embodiment, there is provided a touch interface comprising a printed substrate comprising a trace of molecular ink thereon, the molecular ink being sintered to form a conductive metal trace forming a transparent conductive film.

There is provided a touch interface further comprising printed capacitive or resistive elements.

There is provided a touch interface further comprising a capacitive micro-wire.

There is provided a touch interface in which the capacitive micro-wire comprises a grid or pattern of printed silver electrodes and the substrate is flexible.

There is provided a touch interface in which the capacitive micro-wire is made by laser trimming the conductive metal trace and thereby making the micro-wire capacitive.

There is provided a touch interface in which the capacitive micro-wire is made by performing a selective sintering of the conductive metal trace.

BRIEF DESCRIPTION OF THE DRAWINGS

Further features and advantages of the present disclosure will become apparent from the following detailed description, taken in combination with the appended drawings, in which:

FIG. 4 is a combination of a picture, a table and a graph illustrating the shear force properties and environmental testing results for screen printable molecular silver inks, according to an embodiment;

FIG. 5A is a perspective view illustrating a metal-insulator-metal (MIM) device, according to an embodiment;

FIG. 5B is a top view and table illustrating a printed MIM inductor, according to an embodiment;

FIG. 5C is a top view and table illustrating a printed MIM capacitor, according to an embodiment;

FIGS. 12A-12D are pictures illustrating the printed class 1 engineered surfaces, according to an embodiment;

FIGS. 13A-13B are a picture and a graph illustrating the multi-layer FSS performance of printed class 1 engineered surfaces, according to an embodiment;

FIG. 14 is a top view and perspective view illustrating the installation of class 2 reflectarray gratings interacting with RF signals, according to an embodiment;

FIG. 15 is front views illustrating suitable ink-trace patterns of class 2 FSS-backed reflectarray grating, according to an embodiment; and FIGS. 16A-16B are a perspective view and a graph illustrating a device and results for FSS-Backed reflectarray grating performance, according to an embodiment.

FIG. 17A is a top and bottom view illustrating a selected discrete MMIC chip device for hybrid integration (Single pole, 4 Throw (SP4T) GaAs MMIC Switch), according to an embodiment;

FIG. 17B is a functional diagram and outline drawing of a selected discrete MMIC chip device for hybrid integration (Single pole, 4 Throw (SP4T) GaAs MMIC Switch), according to an embodiment;

FIG. 18A is a top and bottom view illustrating a selected discrete MMIC chip device for hybrid integration (Single Pole Double Throw (SPDT) GaN MMIC Switch), according to an embodiment;

FIG. 18B is a functional diagram and outline drawing of a selected discrete MMIC chip device for hybrid integration (Single Pole Double Throw (SPDT) GaN MMIC Switch), according to an embodiment;

FIG. 23 are graphs illustrating the performance of discrete SPDT chip assembled on flexible substrate (version based on CPW probes), according to an embodiment;

FIGS. 25A-25B are diagrams and a picture illustrating a screen printed multilayer CPW transmission line, according to an embodiment;

FIGS. 26A-26B are graphs and PET substrate specification illustrating wide-band characterization of a screen printed multilayer CPW interconnect, according to an embodiment;

FIG. 27 is a combination of a picture and a graph illustrating screen-printed RF filters on Polyethylene Terephthalate (PET) substrate, according to an embodiment;

FIGS. 28A-28B are a picture and a graph illustrating a screen printed millimeter wave CPW bandpass filter on a flexible plastic substrate PET and performance results, according to an embodiment;

FIG. 29 are pictures illustrating a micro-wire touch interface, according to an embodiment;

FIG. 30 is a table illustrating the geometry of the objects used to mold 3D shapes into the glycol-modified polyethylene terephthalate (PETG) substrate and the measured strain imparted on the substrate as a result of the thermoforming process; and FIG. 31 is a table illustrating the relative resistance changes measured for the traces that have been printed onto PETG, thermoformed and photosintered to produce a conductive silver trace.

It will be noted that throughout the appended drawings, like features are identified by like reference numerals.

DETAILED DESCRIPTION

Figure 1:
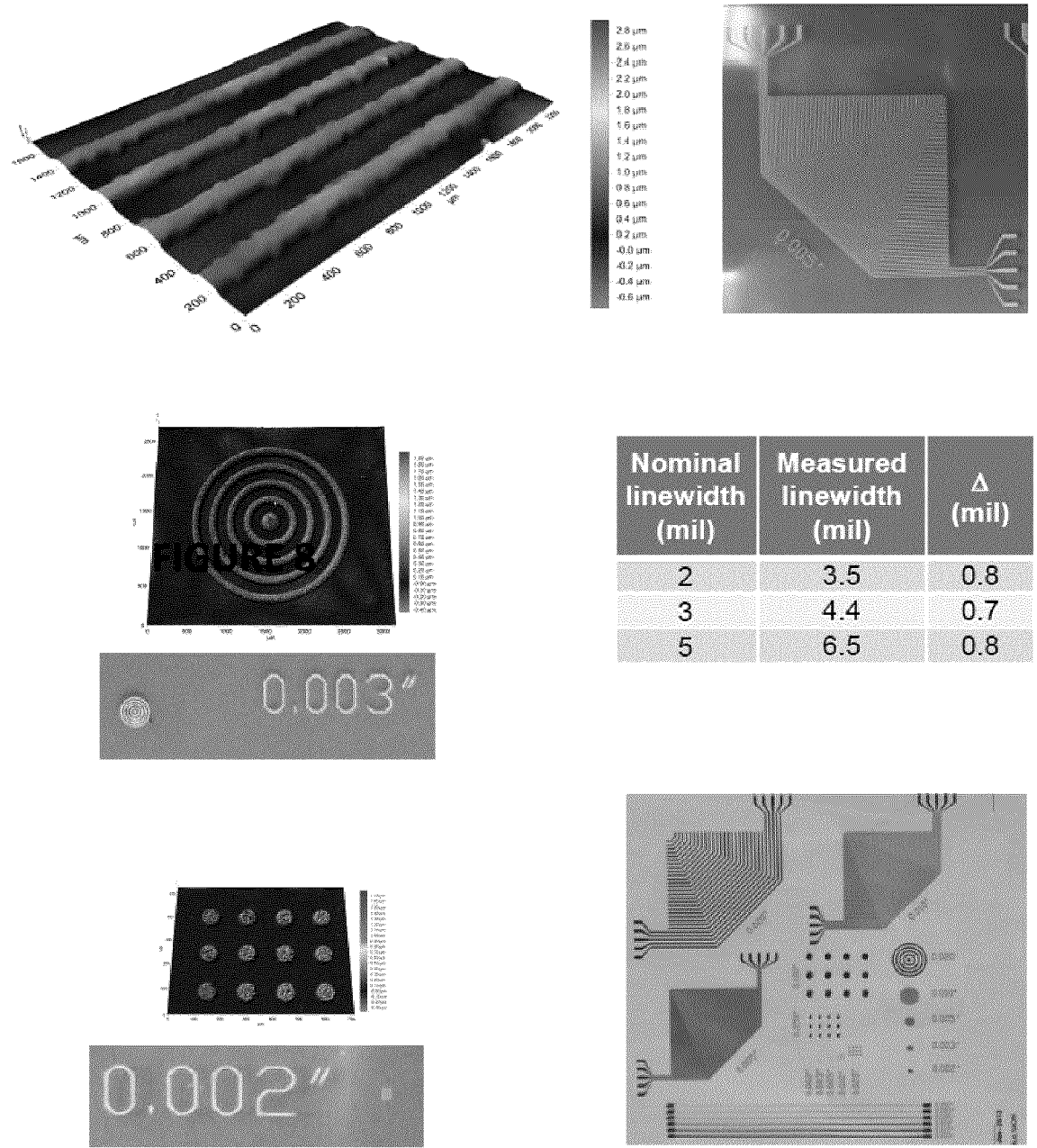
FIG. 1 is a combination of graphs and tables illustrating the result of traces production printed to make up a circuit, according to an embodiment.

There are described below flake and molecular inks and their fabrication method. There are further described printed electronics that can be made using flake and molecular inks. Various applications for printed electronics are contemplated further below.

Flake Inks

Printable electronics, an additive manufacturing technology, combines electronic materials with conventional printing processes in order to enable large area, flexible and/or low-cost manufacturing of OFETs, membrane switches, photovoltaics, antennas, displays and sensors. Conductive inks make up one of the largest markets in printed electronics as they enable the fabrication of key components such as electrodes, OLEDs, antennas and bus bars for current collectors using gravure, aerosol jet, inkjet and screen printing.

Each of these printing techniques has its attributes, but the screen printing of silver flake inks is one of the most mature technologies, which is currently widely used in the manufacture of conductive components in industry. These flake-based inks can produce traces with good sheet resistivity values (10-15 mOhm/sq/mil) and typically have thicknesses of ~4-15 microns. The printed electronics industry is driven by a desire to produce inexpensive functional devices, and simply decreasing the silver content and the resulting trace thickness is an obvious means to decrease costs. However, decreasing the amount of silver deposited is typically not a viable option to decrease material consumption or cost with flake based inks because achieving high conductivity (low volume resistivity) and mechanical robustness in printed conductive traces require overlap of multiple layers of silver flakes and minimum thicknesses of ~4 µm.

Screen printing is a commonly used technique to produce conductive features on flexible substrates and the most common ink employed in the printed electronics industry are based on metal flakes. Industrial facilities typically have problems producing trace widths less than 100 µm and trace thicknesses less than 5 µm. Silver flake inks do not produce sufficiently conductive traces when less than 4 microns in thickness. Furthermore, silver flake inks do not lead to conductive traces that are flexible, nor can they be creased when the thickness is less than 4 microns. Silver flake inks also produce traces that suffer from adhesion limitations which require encapsulation in order to strengthen a joint with a conductive adhesive. Due to the size of the silver flakes (several microns) it is not possible to print sub-micron thick conductive traces, which is highly desired in order to minimize the aspect ratio of narrow traces. In addition, current screen printing inks cannot produce topographically flat surfaces.

As highlighted above, most commercial screen printable inks make use of silver flake formulations. The problems encountered with these flake-based inks stem from their large dimensions (several micron flake size). Because the flake is large, there can be difficulty physically printing it through small screen dimensions and producing uniform traces where all of the flakes overlap well to produce a conductive trace. In the case where screen inks are printed on polymer substrates, the inks must be sintered at lower temperatures and as a result, the flakes are only mildly sintered, generating traces with sheet resistance values typically ranging from 10-50 mOhm/sq/mil. In addition, because the resulting trace is comprised of large overlapping silver flakes, the surface topography is typically rough. Rough surfaces are particularly problematic in RFID applications where performance of the antenna is determined in part by surface roughness. There are examples of using nanoparticles (<100 nm diameters) to overcome this problem, but nanoparticles are relatively expensive to produce, and the performance gain is not sufficient to justify the additional cost.

There remains a need for printable molecular inks that can produce flexible conductive traces, especially molecular inks for screen printing.

Molecular Inks

There is described a flake-less molecular ink suitable for printing (e.g. screen printing, although other printing methods are suitable, as mentioned further below) conductive traces on a substrate has 30-60 wt % of a C8-C12 silver carboxylate or 5-75 wt % of bis(2-ethyl-1-hexylamine) copper (II) formate, bis(octylamine) copper (II) formate or tris(octylamine) copper (II) formate, 0.1-10 wt % of a polymeric binder (e.g. ethyl cellulose) and balance of at least one organic solvent. Conductive traces formed with the molecular ink are thinner, have lower resistivity, have greater adhesion to a substrate than metal flake inks, have better print resolution and are up to 8 times less rough than metal flake inks. In addition, the shear force required to remove light emitting diodes bonded to the traces using Loctite 3880 is at least 1.3 times stronger than for commercially available flake-based inks.

The molecular inks of the present invention comprise three main components: a metal precursor molecule, a binder and at least one organic solvent. Decomposition of the metal precursor molecule during ink processing produces conductive metal particles, the binder binds together the conductive metal particles and provides traces with adequate mechanical properties and adhesion to a substrate, and the solvent is mainly used to help make the ink printable, although the solvent may also dissolve the molecular ink to provide a more homogeneous ink and traces made therefrom. When deposited on a substrate to form traces and appropriately processed (e.g. by heat or light), the metal precursor molecules form conductive nanoparticles that are bound by the binder. The resulting traces are comprised of interconnected metal nanoparticles, but the nanoparticles are produced in situ, so the cost of the ink can compete with that of commercial flake based inks. In addition, due to the interconnected nanoparticle structure, the resistivity values are lower than metal flake-based inks. Further, traces derived from molecular inks show improved bonding to adhesives than metal flake-based inks, have better print resolution than metal flake-based inks and are up to 8 times less rough than metal flake-based inks.

The molecular ink is flake-less, not making use of metallic flakes to provide conductivity. Instead, the molecular ink comprises a metal precursor molecule, specifically a metal carboxylate, more specifically a C8-C12 silver carboxylate or bis(2-ethyl-1-hexylamine) copper (II) formate, bis(octylamine) copper (II) formate or tris(octylamine) copper (II) formate. Because the ink does not contain flakes, conductive traces formed from the ink comprise interconnected metal nanoparticles, which permit the formation of very thin and narrow conductive traces.

The molecular ink comprises a composition comprising about 30-60 wt % of a C8-C12 silver carboxylate or about 5-75 wt % of bis(2-ethyl-1-hexylamine) copper (II) formate, bis(octylamine) copper (II) formate or tris(octylamine) copper (II) formate, weights based on total weight of the composition. Preferably, the composition comprises about 45-55 wt %, for example about 50 wt %, of the silver carboxylate, or about 65-75 wt %, for example about 72 wt %, of the bis(2-ethyl-1-hexylamine) copper (II) formate, bis(octylamine) copper (II) formate or tris(octylamine) copper (II) formate.

While the ink may be formulated for any kind of printing, the ink is particularly suited for screen printing. In this regard, the ink preferably has a viscosity of about 1500 cP or greater. Further, the solvent preferably has a sufficiently high boiling point so that the ink evaporates slowly during printing. This is known to increase the number of printing cycles that can be carried out before the ink must be thinned to improve performance.

The molecular ink may be deposited, for example printed, onto a substrate to form a trace of the ink on the substrate. Drying and decomposing silver salts within the trace to form conductive traces may be accomplished by any suitable technique, where the techniques and conditions are guided by the type of substrate on which the traces are deposited. For example, drying and decomposing silver salts may be accomplished by heating and/or photonic sintering.

Inks of the present invention may be deposited on a substrate by any suitable method, for example screen printing, inkjet printing, flexography printing (e.g. stamps), gravure printing, off-set printing, airbrushing, aerosol printing, typesetting, or any other method. After deposition, the ink may be dried or cured, for example by allowing the ink to dry in ambient conditions or heating the ink for an appropriately long period of time to evaporate the solvent. The inks of the present invention are particularly suited to screen printing.

Molecular inks of the prior art are generally not formulated for screen printing and result in screen-printed conductive traces having limited adhesion to substrates. Limited adhesion leads to open circuit breaks and total loss in conductivity (i.e. infinite resistivity) as the trace delaminates from the substrate surface or as the trace forms macrostructural or microstructural cracks. In contrast, conductive traces of the present invention have good adhesion to substrates as discussed above, and do not develop open circuit breaks over a period of at least 1 day, preferably at least 1 month, more preferably at least 1 year. Printed traces from the present invention get a grade of 5B (no flaking occurred) following the Cross-Hatch Adhesion Test (ASTM F1842-09).

Conductive traces formed with the molecular ink are thinner, have lower resistivity, have better print resolution and are up to 8 times less rough than metal flake inks. In addition, the shear force required to remove light emitting diodes (LED) bonded to the traces using an epoxy adhesive is at least 1.2 times stronger than for commercially available flake-based inks. The substrate may be any printable surface. Printable surfaces may include, for example polyethylene terephthalate (PET) (e.g. Melinex™), polyolefin (e.g. silica-filled polyolefin (Teslin™)), polydimethylsiloxane (PDMS), polystyrene, polycarbonate, polyimide (e.g. Kapton™), silicone membranes, textiles (e.g. cellulosic textiles), paper, glass, metal, dielectric coatings, among others. Flexible substrates are preferred.

The printed conductive trace on the substrate may be incorporated into an electronic device, for example electrical circuits, conductive bus bars (e.g. for photovoltaic cells), sensors, antennae (e.g. RFID antennae), touch sensors, thin film transistors, diodes, and smart packaging (e.g. smart drug packaging). The molecular ink of the present invention enables miniaturization of such electronic devices.

Electric Components Based on Printed Electronics

Molecular inks are used as described above to print traces of ink making up a circuit, or a portion thereof. Results of traces production are shown in FIG. 1.

Figure 2:
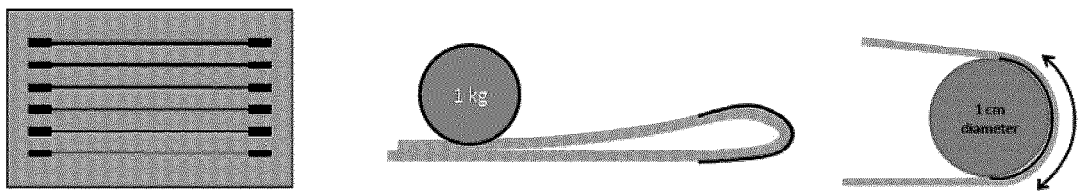
FIG. 2 is a combination of a top view, side views and a table illustrating the mechanical properties tested using ASTM F1683-02 bend and crease testing on a printed electronic device, according to an embodiment.

Mechanical properties were tested using ASTM F1683-02 bend and crease testing, as shown in FIG. 2.

There are now described the advantageous properties of screen printable molecular silver inks. The purpose is to develop a screen printable ink that can produce functional, thin and high resolution traces with high conductivity and robust mechanical properties.

Figure 3:
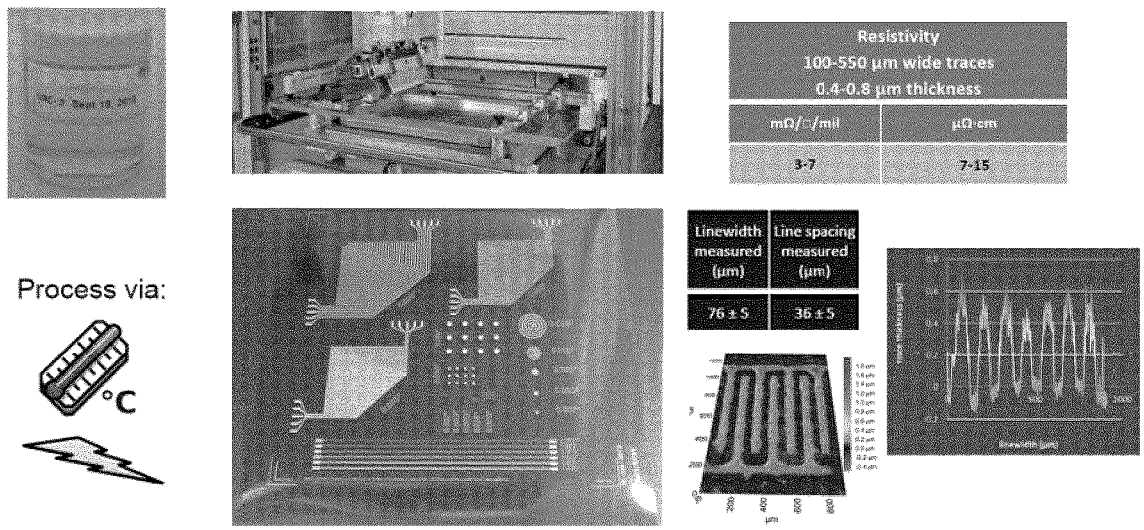
FIG. 3 is a combination of pictures, tables and graphs illustrating the electrical properties and trace resolution of screen printable molecular silver inks, according to an embodiment.

Electrical properties and trace resolution of screen printable molecular silver inks are shown in FIG. 3.

Shear force properties and environmental testing results are shown in FIG. 4.

Figure 5D:
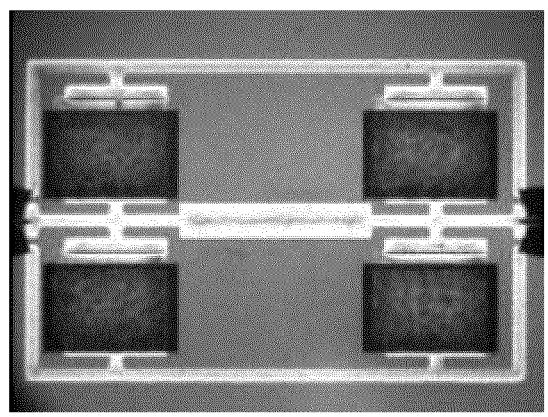
FIG. 5D is a top view illustrating a printed MIM low-pass filter, according to an embodiment.

Various devices can benefit from the properties described above. The basis for various devices includes building metal-insulator-metal (MIM) devices generally shown in FIG. 5A (metal on insulator on metal). FIG. 5B shows an inductor made of ink as described above printed on a substrate or on a dielectric material (i.e., insulator between the metals). It shows that inductances can be built successfully by printing molecular ink.

Figure 5E:
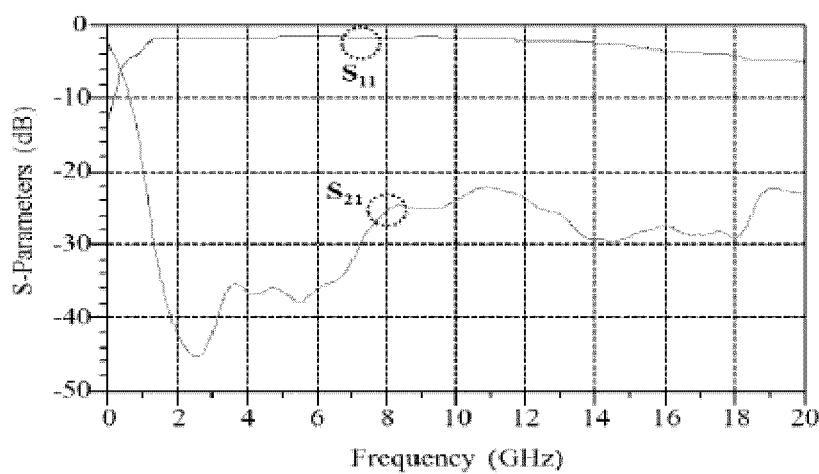
FIG. 5E is a graph illustrating the electrical behavior of a printed MIM low-pass filter, according to an embodiment.
Figure 6:
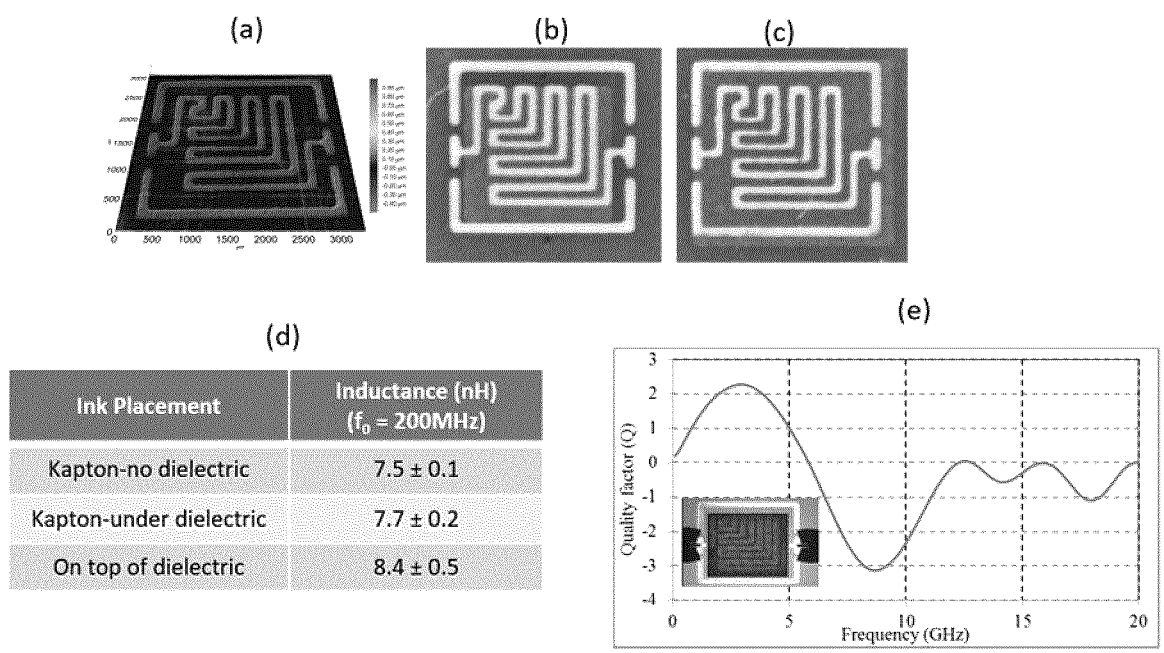
FIGS. 6A-E are a profilometer image comparison of the molecular silver ink printed directly on Kapton substrate with no dielectric (a), encapsulated with a printed dielectric (b) and as a second layer on a printed dielectric layer (c), performance of the inductors printed on each surface (d) and a representative quality factor of the inductors (e), according to an embodiment.

The same result applies to capacitors (FIG. 5C) and electronic filters such as low-pass filters (FIG. 5D), which can also be built successfully by printing molecular ink. The electric behavior of the low-pass filter is also shown in FIG. 5E. It demonstrates that molecular-ink printed low-pass filters have a sharp rejection slope (i.e., it filters more sharply than flake inks) and have very low insertion loss in passband (i.e., the signal is not attenuated in useful frequencies). The response of this device is spurious-free up to 20 GHz. Because of the nature of the device (i.e., printed with the high circuit density allowed by molecular ink), the device is particularly compact.

Figure 7:
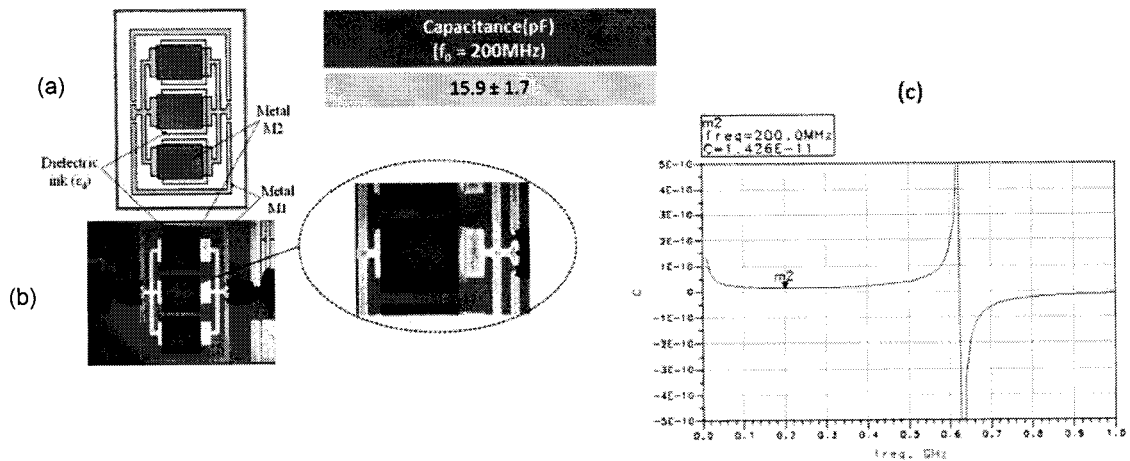
FIGS. 7A-C are a schematic (a) and a photograph (b) of a three layer, all-printed Metal-Insutator-Metal (MIM) capacitor on plastic substrate (Kapton) using the molecular silver ink and measurement results of three shunt MIM capacitors versus frequency (c), according to an embodiment.
Figure 8:
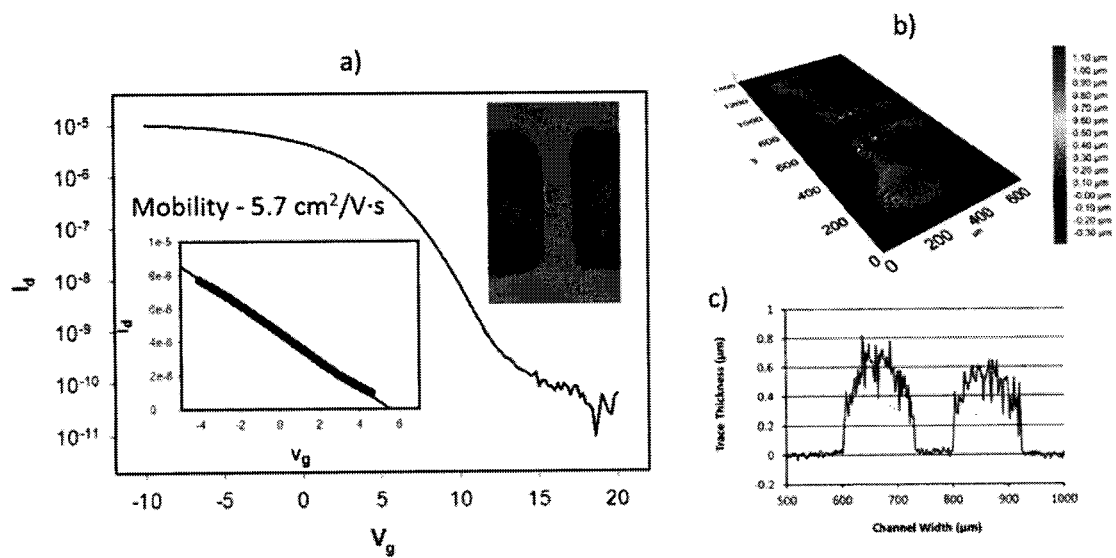
FIGS. 8A-C are an optical micrograph of the TFT as an inset at the top right (a) and the linear fit to the transfer curve as an inset in the bottom left (a), an optical profilometer image of the transistor (b) and a cross section of the channel width (c), according to an embodiment.

FIGS. 6A-E are a profilometer image comparison of the molecular silver ink printed directly on Kapton substrate with no dielectric (a), encapsulated with a printed dielectric (b) and as a second layer on a printed dielectric layer (c), performance of the inductors printed on each surface (d) and a representative quality factor of the inductors (e), according to an embodiment;

FIGS. 7A-C are a schematic (a) and a photograph (b) of a three layer, all-printed Metal-Insulator-Metal (MIM) capacitor on plastic substrate (Kapton) using the molecular silver ink and measurement results of three shunt MIM capacitors versus frequency (c), according to an embodiment;

FIGS. 8A-C are an optical micrograph of the TFT as an inset at the top right (a) and the linear fit to the transfer curve as an inset in the bottom left (a), an optical profilometer image of the transistor (b) and a cross section of the channel width (c), according to an embodiment.

Circuits Made of Molecular Inks

Molecular inks can serve as new conductors for advanced user interfaces, circuits and devices.

Printed electronics is a disruptive manufacturing technique that combines functional materials and printing to make electronic devices in new form factors and enables innovative products. Printed electronics will yield breakthrough technologies in sensing, displays and wireless communication.

New molecular inks can be used to enhance the field of applications for printed electronics. This applies to both silver molecular inks and copper molecular inks described above.

Molecular inks described above provide the electrical performance of nanoparticle inks with cost of flake inks.

Molecular inks can be used to fabricate traces of ink with sub-micron trace thickness to enable production of narrow traces.

Molecular inks used in circuits have robust mechanical properties.

The use of molecular inks also allows the creation of new or improved polyimide flex circuits and a new solder-able surface finish for polyimide flex circuits or rigid epoxy printed boards.

These properties of molecular inks can be used to fabricate existing electronic products with these molecular inks to provide improved properties, or entirely new products.

There will now be described advantageous properties of molecular inks. These properties are suitable for circuit fabrication.

Molecular copper inks have low sintering temperature. Despite the ease of sintering and excellent electrical properties of silver inks, the high cost of silver is becoming an issue for printed applications where the main driver for printing is cost. Thus, there has been developed a low cost copper screen ink with the following properties: Low cost copper precursors; Sinters at 150° C. making it compatible with PET (inexpensive flexible substrate); Resistivities 2 to 5 times bulk copper values; Good mechanical properties (ASTM F1683-02).

Copper inks are robust with respect to oxidation. They require simple preparation, they are stable and screen printable. Circuits made of molecular copper inks have the following properties: High resolution (2-20 mil line features); Sintering on PET as well as Kapton; Thermal sintering under N2 (500 ppm O2); Photonic sintering in Air; Resistivity 20-30 mΩ/sq/mil; Oxidation resistance Cu traces.

Applications of Printed Electronics Using Molecular Inks and Other Inks

Printed electronics circuits, components, and devices can be developed using flexible or rigid substrates with silver flake, nanoparticles or molecular inks and semi-conductive, carbon nanotubes or dielectric inks. For reasons explained below, molecular inks are preferred for most applications and bring many advantages. In some cases (UHF filters), they are the only suitable choice.

Various applications are contemplated using these inks, such as the following:
  Passive or Active rigid or flexible Printed electronic components
  Flexible or rigid Printed circuits boards
  Solder-able Printed circuits boards
  Printed and Flexible heating elements, e.g., for aerospace applications
  Printed coplanar waveguides, RF antennas, RF filters and hybrid RF devices
  Printed RF engineered filtering or reflecting or orienting surfaces at selective frequency
  Printed flexible or rigid solar cells
  Printed semiconductor devices
  Printed Micro-wire flexible or rigid Touch interface
  Printed flexible or rigid transparent electrodes
  Printed capacitive or resistive flexible or rigid interface
  Printed and flexible electroluminescent lamps
  Wearable electronics printed on flexible substrate
  Printed physicochemical and electromechanical sensors As described above, molecular inks have very advantageous mechanical and electrical properties, notably a higher trace resolution which allows for a greater circuit density and a better uniformity and thickness of the printed trace. These traces have greater mechanical flexibility and can withstand higher current densities. These advantages can be used for example in making filters (e.g., low-, high- or band-pass filters) with improved spectral resolutions over those achieved using flake inks. It can also be used to make an antenna usable with much higher frequencies than those that flake inks can withstand.

RF Applications

Figure 9:
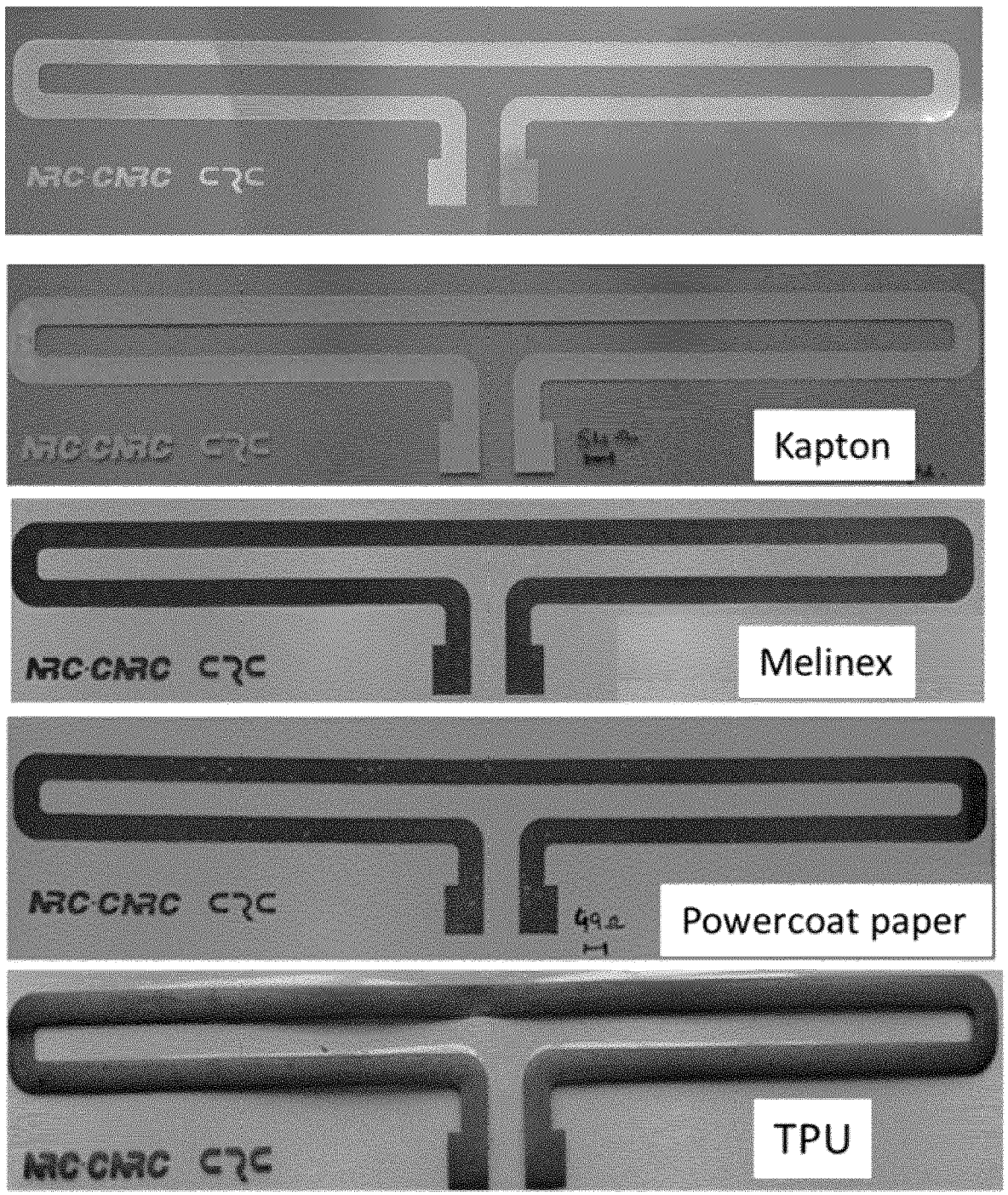
FIG. 9 is a top view illustrating an ultra high-frequency RF antenna, according to an embodiment.

An application of molecular inks is a screen printed ultra-high frequency (UHF) antenna. An embodiment of such an antenna is shown in FIG. 9. The use of molecular ink, with its electrical properties and great control of the surface profile of the trace, allows interacting with signals of frequencies that would be unreachable for other types of inks, such as flake inks.

Figure 10:
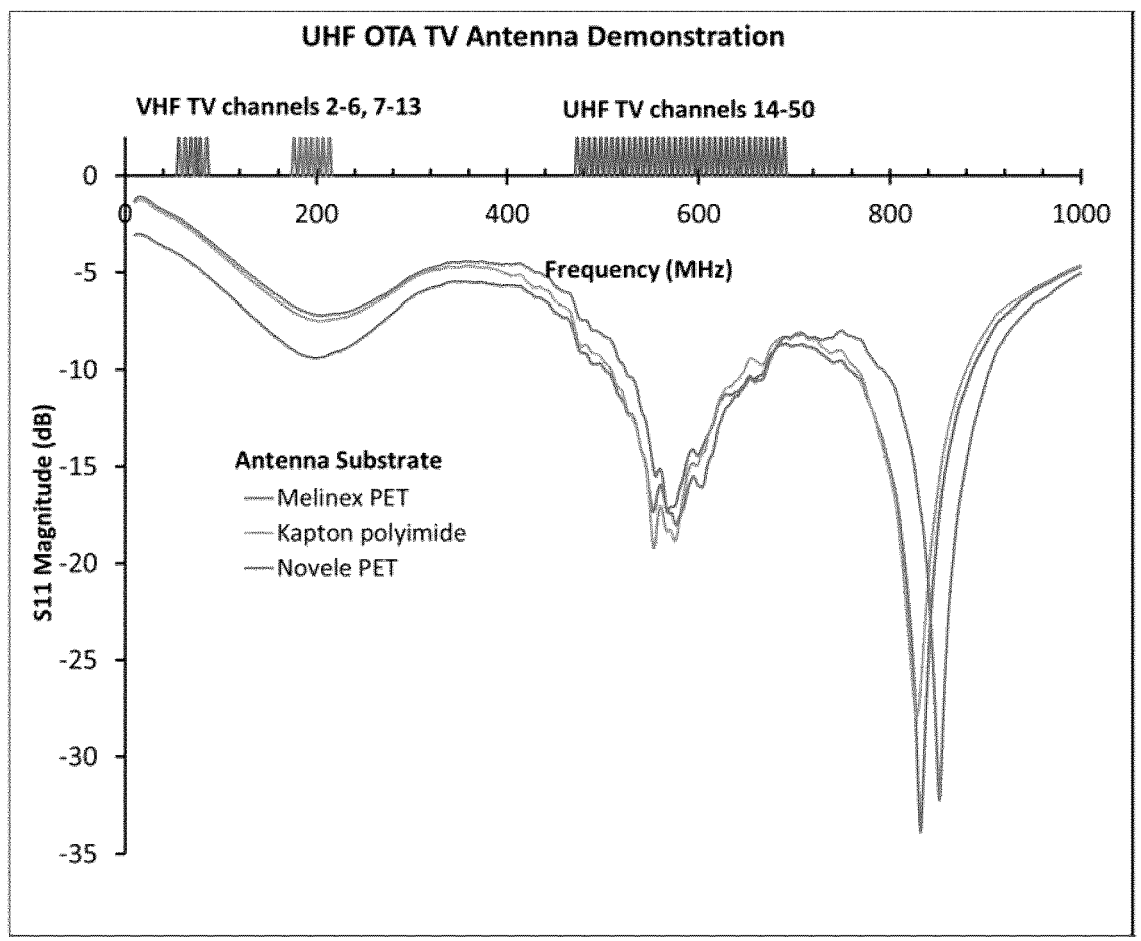
FIG. 10 is a graph illustrating the filtering behavior of an ultra high-frequency RF antenna, according to an embodiment.

Empirical results of the spectral behavior of an embodiment of antenna are shown in FIG. 10.

Measurement results: Top of graph: Location (in frequency) of TV channels in VHF-low, VHF-high and UHF bands. Lower value of S11 indicates higher received power (higher probability of receiving a channel at its designated frequency)

Measurement highlights: Antennas on Kapton (polyimide) and Melinex (PET) substrates produced similar performance in the UHF band. Antennas on Melinex provided a better response in the upper VHF band.

Various properties and remarks are shown in Table 1.

TABLE 1

Properties of printed antennas

| Property | Highlight |
| --- | --- |
| Multiple Modes of Processing | Thermal and Photonic sintering possible on Kapton and PET-based substrates with similar results |
| Sheet resistivity | 3-8 mΩ/—/mil with both thermal and photonic sintering |
| Resolution | Print lines as narrow as 41 μm |
| L/S | Print 76 μfeatures with as little as 36 μm space between features |
| Multilayer Printability | Printed ink produces uniform traces on rough dielectric surfaces with excellent electrical properties Demonstrated MIM devices, UHF antenna |
| Flexibility | <10% change in resistance following ASTM F1683-02 flex and crease testing |
| Adhesion | Grade 5B following ASTM F1842-09 testing |
| Silver Migration | None - following encapsulation with PF455 dielectric |
| Component Assembly | Compatible with commercially available Ag adhesive, allowing 2X stronger bond of LED than to typical commercially available flake ink |

Telecom Applications

Mobile wireless traffic is expected to increase by a factor of a thousand in the upcoming years. Adopting smaller cells and packing them closer together are among the methods to keep up with this significant surge. Drawbacks to this approach include the increased number of base station towers required and the increased intercellular interference. Such interference will degrade the system performance causing packet losses and throughput reductions, and it may also compromise the security and privacy of the system. Therefore, it is critical to develop innovative solutions that allow systems to operate effectively in the presence of interference and achieve increased mobile broadband capacity. Two approaches are being considered: engineered surfaces and wrap-around shaped-beam arrays. Both involve printed RF engineered filtering or reflecting or orienting surfaces at a selective frequency band using the inks mentioned above.

Engineered surfaces are single or multiple sheets of large and thin flexible dielectric substrates patterned with a periodic lattice of small metallic or dielectric elements and which can be advantageously made of the inks mentioned above.

These surfaces are designed to selectively reflect or transmit electromagnetic signals based on their frequency and can be used to block, redirect or transmit signals. These engineered surfaces can be deployed on flat or curved surfaces to reduce interference and/or improve wireless coverage and spectrum efficiency. More specifically, they can be deployed on buildings or urban infrastructures to environmentally manage electromagnetic signals in a controlled manner to improve broadband mobile coverage. This opens up new possibilities for using higher-frequency bands, since the current propagation models for urban environments, which indicate poor signal performance at higher bands, are based on the assumptions that the electromagnetic propagation cannot be controlled. These resources have long gone unnoticed and underused as a result of their shear expanse and the technical complexity of covering them with low-cost, durable, and flexible materials with superior electrical performance.

Printed electronics (PE) can overcome the technical barriers of the integration of engineered surfaces into buildings and urban infrastructures, thanks to their fabrication methods. Furthermore, they can henceforth be used to alter and manage the signal environment within the coverage area.

Wrap-around shaped-beam arrays can be deployed for outdoor environments, for example, on lamp-posts, to convert this prevalent and ubiquitous piece of infrastructure into the backbone of a network of base stations with large angle coverage, eliminating the costly deployment of visually unappealing base station towers. Such a development will be low cost due to the current availability of real estate and electrical power at each post. In addition, the radiation beams of these arrays can be adjusted in order to reduce the amount of spillover into adjacent cells, thus reducing interference. For indoor environments, this same strategy can be used to blend wrap-around shaped-beam arrays into pillars to extend the reach of signals into dead zones and increase the channel capacity by shaping the coverage.

Printed electronics (PE) can be used advantageously to enable the design and facilitate deployment of large-area engineered surfaces and wrap-around shaped-beam arrays. This can be achieved by deploying large and flexible PE generated sheets as wallpaper onto the facade and/or inner surfaces of buildings or urban infrastructures. These flexible PE generated sheets can use various inks as mentioned above, e.g., flake inks but also molecular inks.

Notable examples of such a development are installation of frequency selective surfaces (FSS) to block/allow certain frequency bands or optically semi-transparent ink-based structures to control signal penetration into buildings without compromising natural lighting exposure of the indoor area. PE generated surfaces can also be designed to selectively shape the coverage to remove dead zones or shadow areas. Another relevant and highly versatile extension of these advanced developments will be on-demand exclusion of certain coverage areas in compliance with cyber-security requirements. The second objective is the deployment of wrap-around shaped beam arrays around lamp-posts or pillars using PE, thus reducing the need for additional tower infrastructure. Such a development is now possible due to the flexible nature of PE generated surfaces. Novel semiconductor and ferroelectric inks, that have been under intensive development in the facilities of NRC and PE consortium members, will significantly broaden the functionality of these wrap-around shaped-beam arrays by enabling dynamic variation of operating frequency, coverage, and/or signal polarization, which are key features in the realization of higher channel capacity.

This control of the electromagnetic environment is enabled by the unique features of PE to realize engineered surfaces and wrap-around antenna arrays on flexible substrates requiring conformal realization (operates independently of orientation, which is not possible in conventional planar counterparts) that can cover large footprints. In addition, this technology can take advantage from the potential of emerging adaptive materials such as ferroelectrics for the implementation of tunable structures, shaped beam arrays, and tunable engineered surfaces. Flexible engineered surfaces have been developed at ISM bands or other microwave frequencies bands of interest using different printing technologies such as screen printing and ink jet.

A practical implementation of this technology would be engineered surfaces (ES) for 5G mobile wireless communications.

Figure 11:
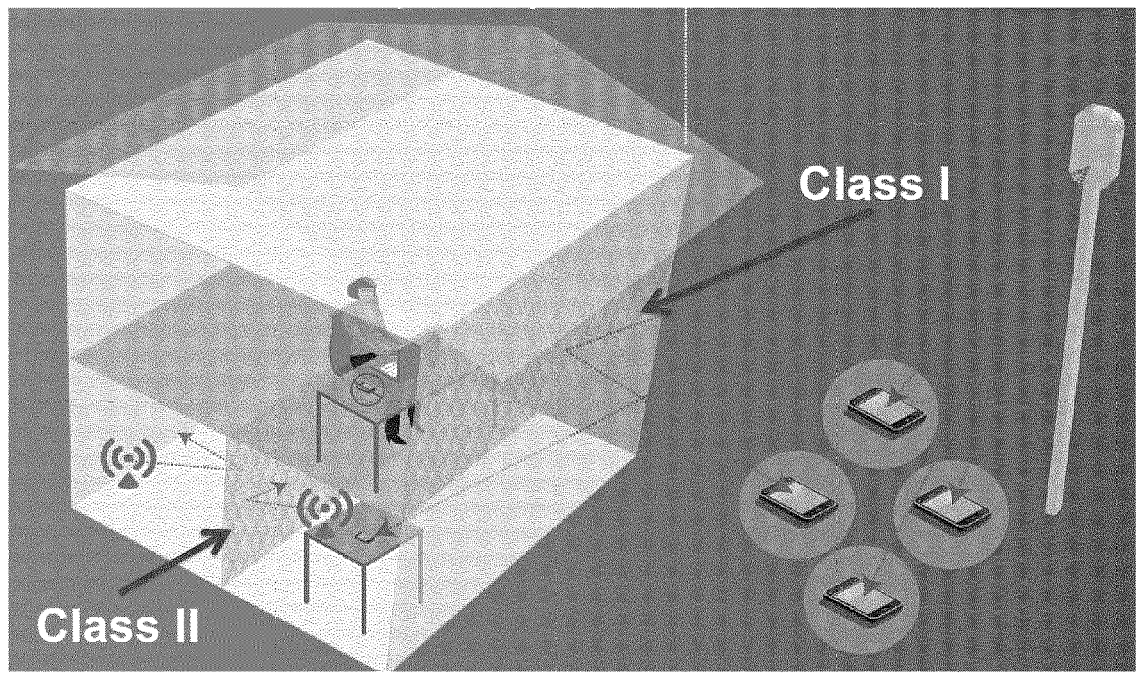
FIG. 11 is a perspective view illustrating the filtering class 1 and class 2 engineered surfaces interacting with RF signals, according to an embodiment.
Figure 19A:
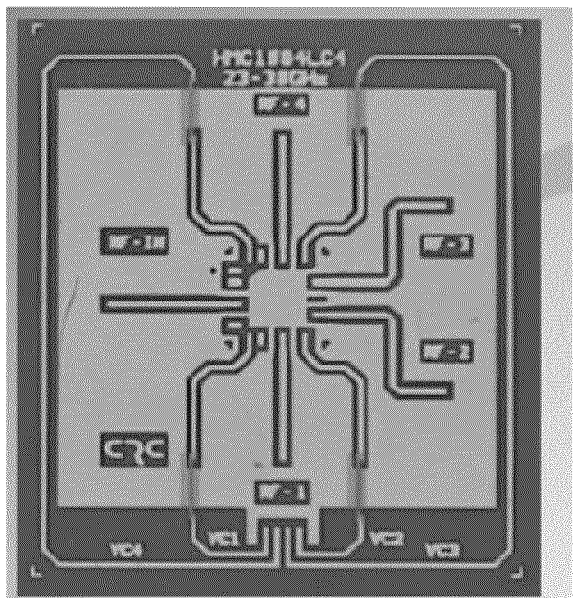
FIG. 19A is a top view illustrating a discrete SP4T chip device assembled on flexible substrate, according to an embodiment.
Figure 19B:
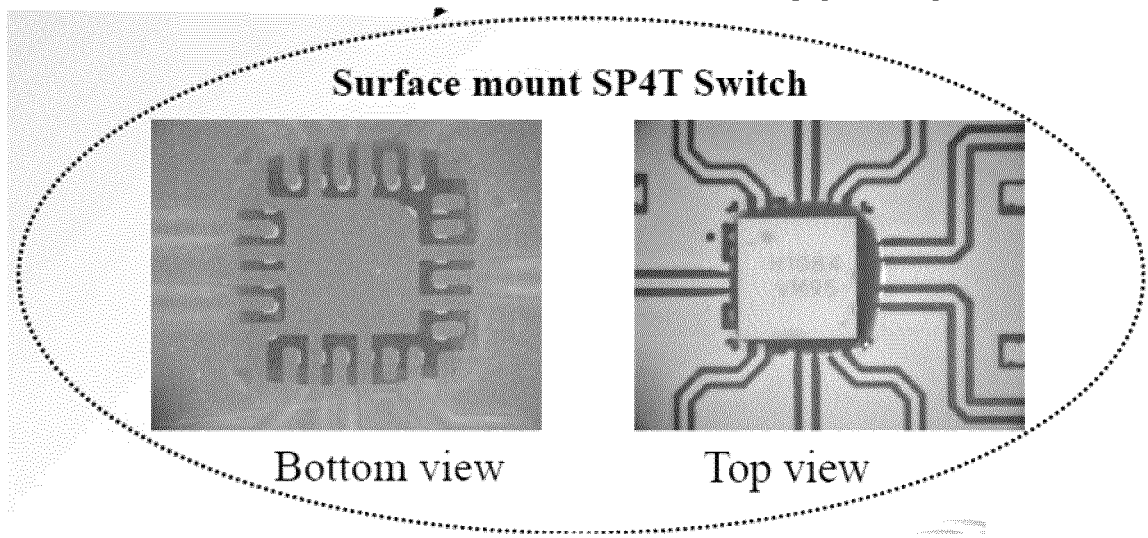
FIG. 19B is a zoom in of a bottom and top view illustrating a discrete SP4T chip device assembled on flexible substrate, according to an embodiment.
Figure 20A:
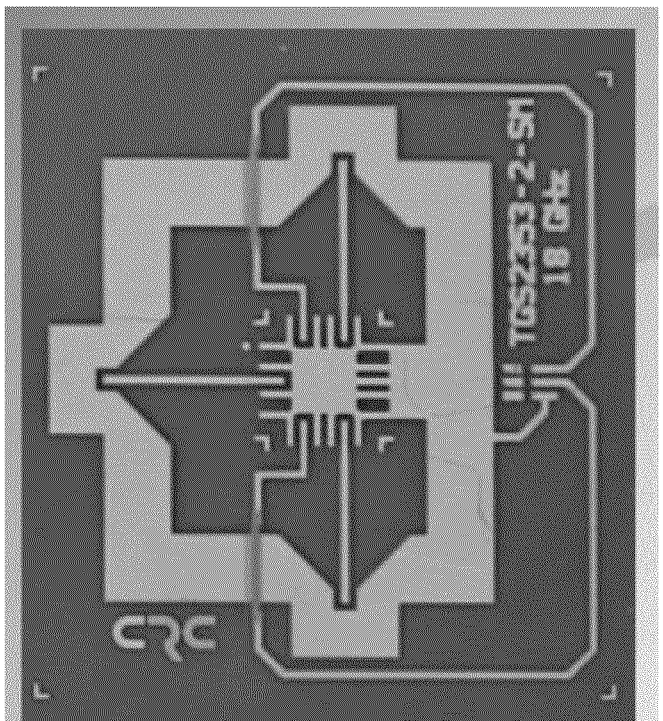
FIG. 20A is a top view illustrating a discrete SPDT chip device assembled on flexible substrate (version based on CPW probes), according to an embodiment.
Figure 20B:
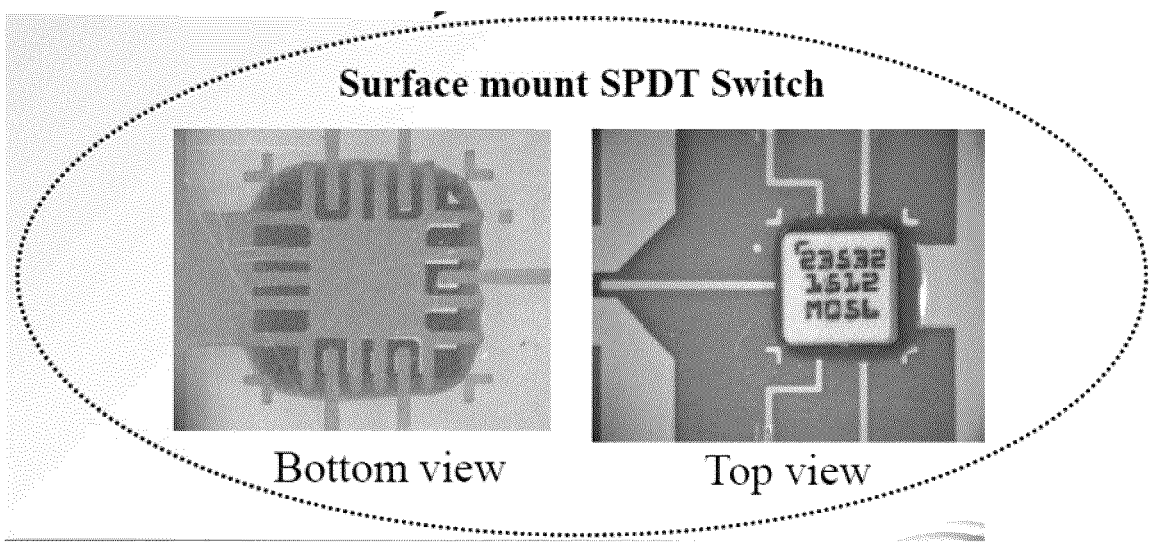
FIG. 20B is a zoom in of a bottom and top view illustrating a discrete SPDT chip device assembled on flexible substrate (version based on CPW probes), according to an embodiment.
Figure 21A:
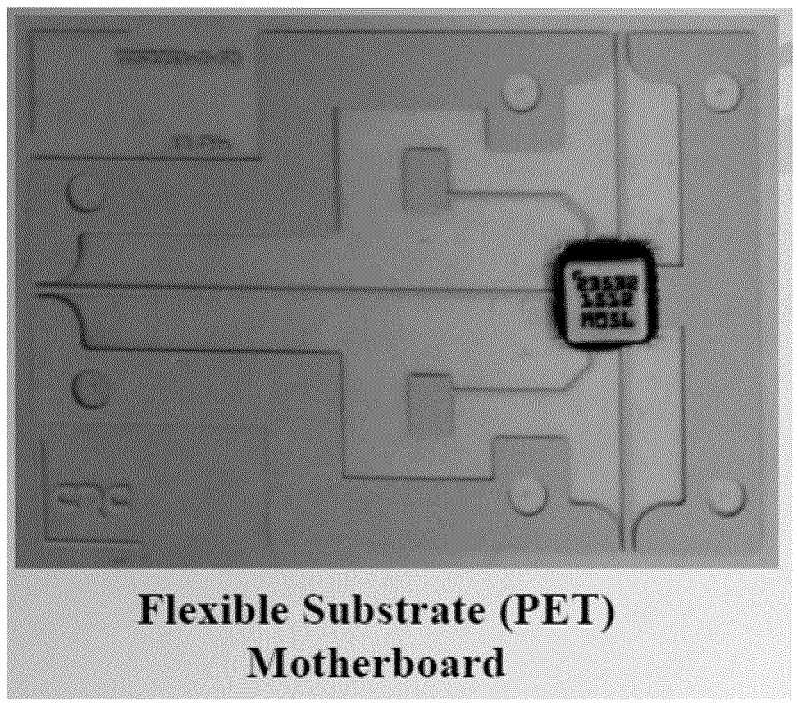
FIGS. 21A-21B is a top view and a diagram illustrating a discrete SPDT chip device assembled on flexible substrate (version based on connectors), according to an embodiment.
Figure 21B:
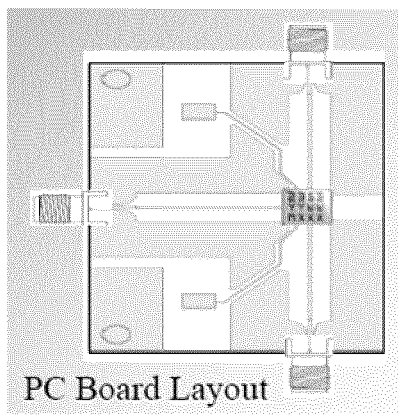
Figure 21C:
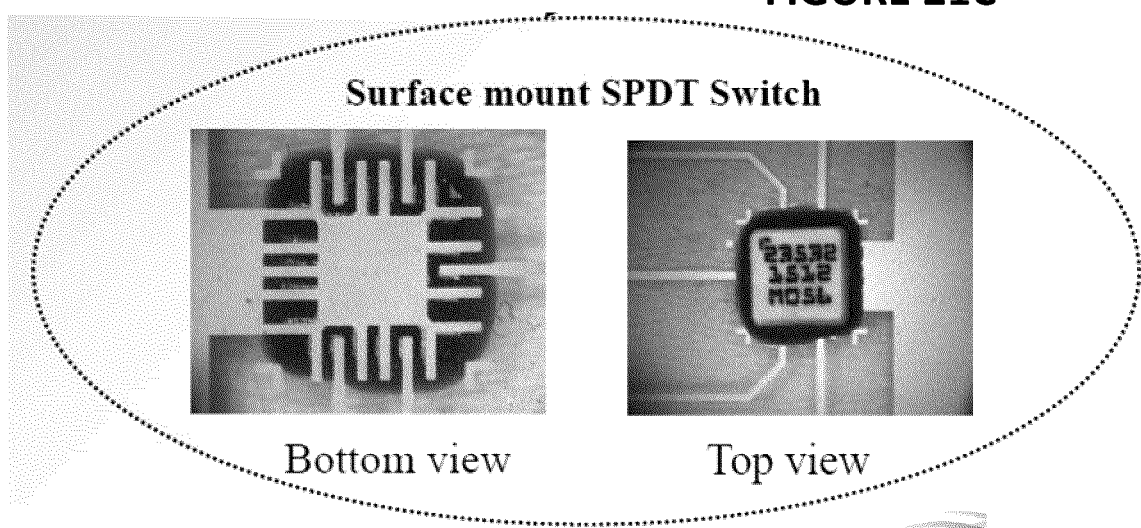
FIG. 21C is a zoom in of a bottom and top view illustrating a discrete SPDT chip device assembled on flexible substrate (version based on connectors), according to an embodiment.
Figure 22:
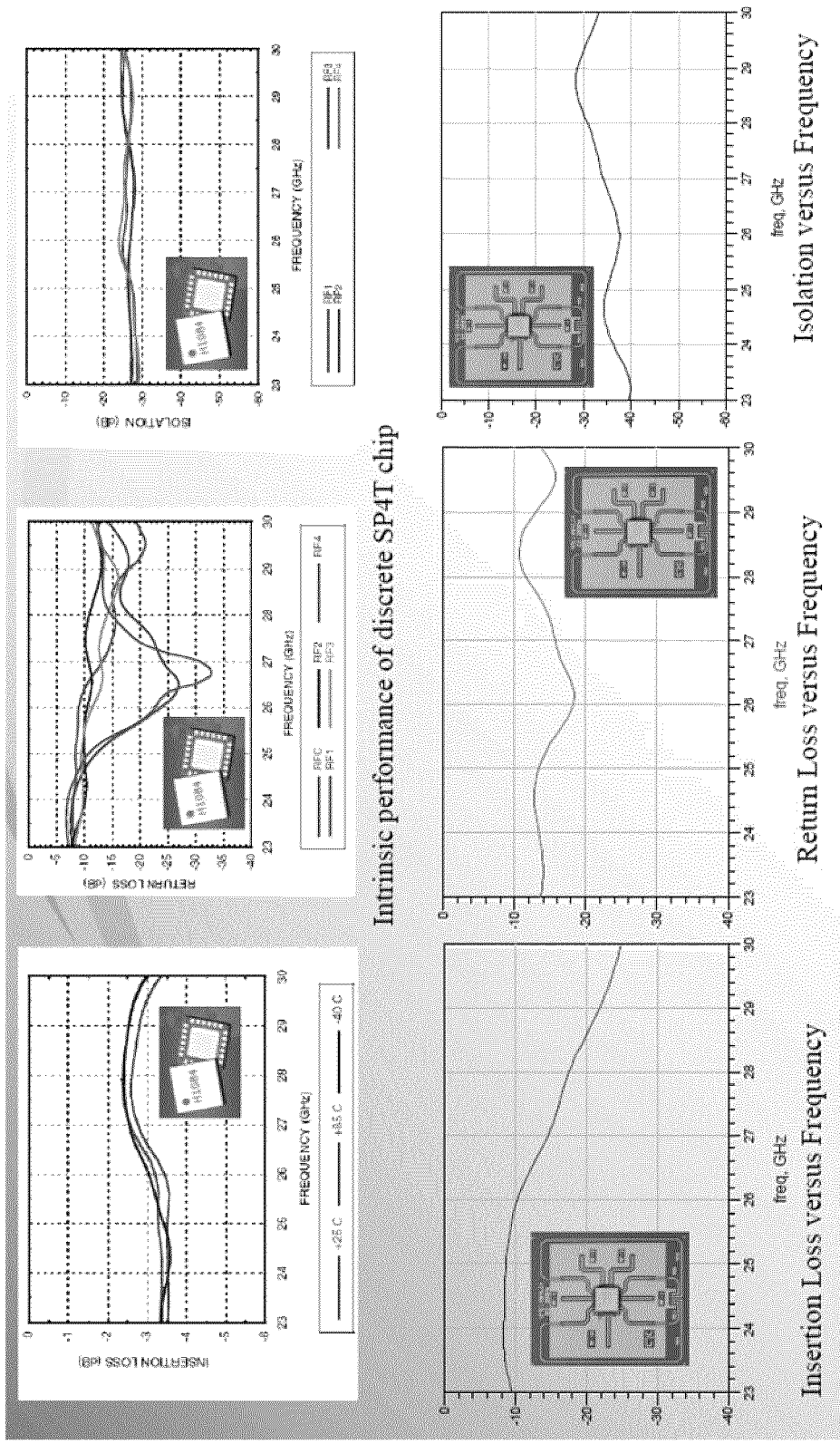
FIG. 22 are graphs illustrating the performance of discrete SP4T chip assembled on flexible substrate, according to an embodiment.
Figure 24:
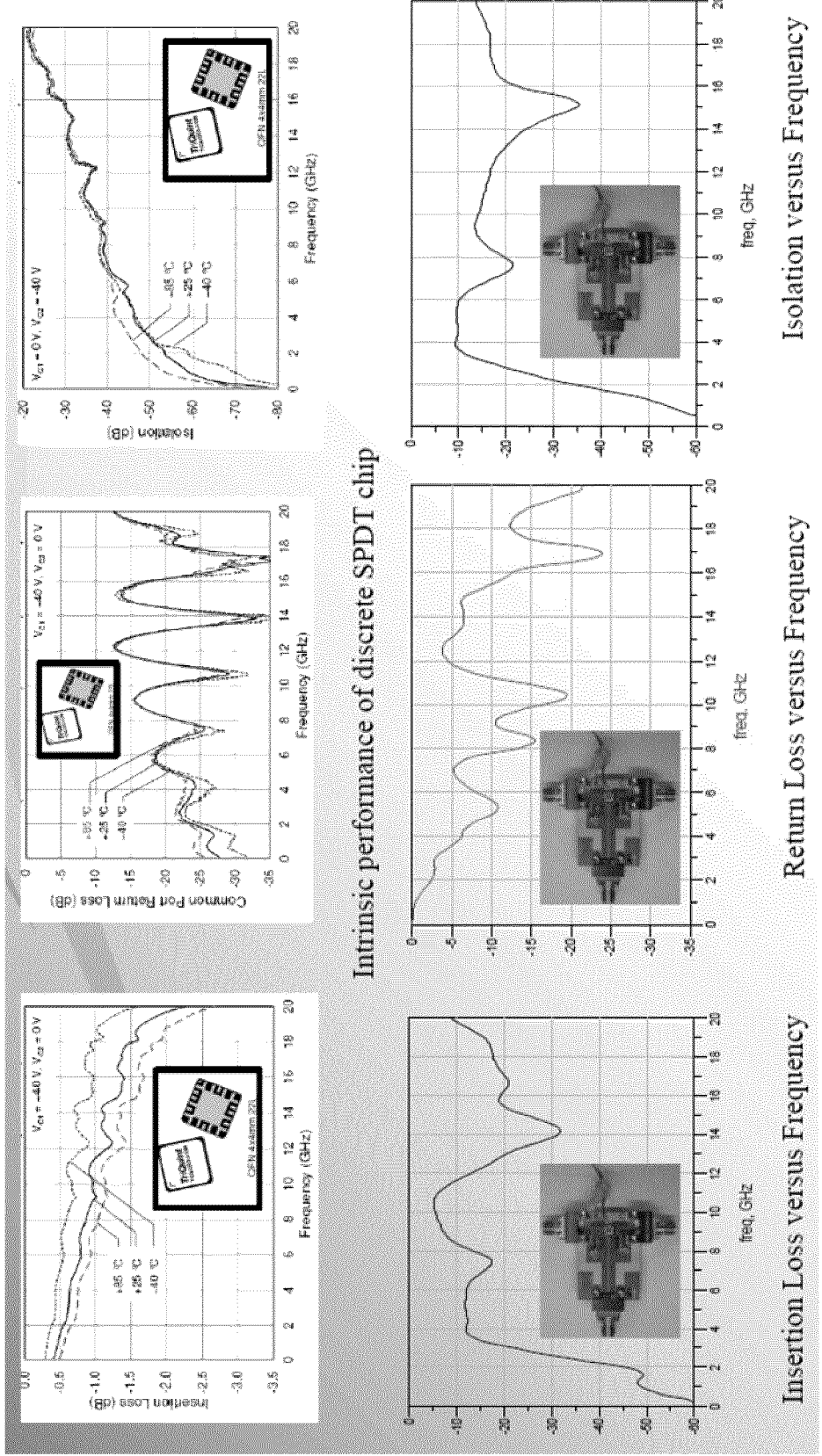
FIG. 24 are graphs illustrating the performance of discrete SPDT chip assembled on flexible substrate (version based on connectors), according to an embodiment.

In order to be used in this context engineered surfaces are deployed at strategic locations to alter the propagation environment for coverage control, security enhancement and/or interference mitigation. For coverage control, two types of engineered surfaces need to be provided: class 1 surfaces, which are frequency-selective whose reflection/transmission properties are a function of frequency, normally used on the envelope of a building; and class 2 surfaces, which are reflectarray gratings or diffusers that redirect signals, normally used within building (e.g., on walls). Installation of both classes of ES is shown in FIG. 11.

Printed electronics unique features make possible the fabrication of both classes of engineered surfaces with the inks mentioned above. Flake inks, conductive inks comprising nanoparticles and semiconductor inks (either organic or inorganic) can be used for this purpose. Molecular inks as those described above are also contemplated.

Class I: Frequency Selective Surfaces (FSS) can be deployed on walls/windows to block/transmit signals for given zones (security). They can also mitigate interference between adjacent zones. Class 1 FSS are shown in FIGS. 12A-12D, where various appropriate ink-trace patterns are illustrated. Class 1 FSS can be printed on flexible substrates, including transparent substrates for greater subtlety or for installation in windows. Multi-layer FSS performance is shown in FIGS. 13A-13B.

Class 2 reflectarray gratings or diffusers can be deployed at strategic locations to illuminate blind spots in a building, enhance multipath signal transmission, enhance coverage or create quiet zones. This kind of advantageous signal alteration is shown in FIG. 14.

Suitable ink-trace patterns for Class 2 reflectarray gratings are shown in FIG. 15.

An FSS-backed Reflectarray Grating performance can be characterized using the device shown in FIG. 16A. The resulting reflection spectrum is shown in FIG. 16B.

Printed electronics also enable various functions useful for implementing 5G mobile network technology. For example, multilayer ES can be developed based on a combination of metal and dielectric inks for higher frequencies in the 5G bands. Reconfigurable ES are also made possible using printed electronic or electro-mechanical technologies to enable real-time dynamic control.

Aerospace Applications

As described above, various types of inks can be used on a variety of substrates. For example, silver flake, nanoparticles or molecular inks and semi-conductive, carbon nanotubes or dielectric inks can be used on flexible or rigid substrates.

Mechanical and electrical properties described above demonstrate the potential reliability of products made of such inks and substrates.

Aerospace is a field where high reliability is required for product integration into aircraft subsystems. An example of an application of printed electronics in aircrafts is the introduction of printed and flexible heating elements into components that need to be heated. Wings of an aircraft are an example of an aircraft subsystem that needs to be heated during travel to avoid ice buildup on the wings exposed to very low temperatures.

Currently, plane wings are heated using aluminum tubes that bring hot air from the engine into the wing to prevent the formation of ice on the wings. These aluminum tubes are nonetheless heavy and change the weight profile of the wings.

It would be preferable if these aluminum tubes were absent from the wings.

The use of printed and flexible heating elements comprising printed electronics made of the inks mentioned above can replace these aluminum tubes.

The flexible nature of these heating elements allows coating the inside of the wings with these heating elements with great ease.

Moreover, the substrate of these heating elements is usually thin and lightweight. The substantial addition of weight in the wings of the aircraft is thereby avoided. This has an advantageous impact on the weight of the wings and of the aircraft, improving the overall performance.

Furthermore, the substrate can coat the inner surface of the wings. Since the circuits make up a greater fraction of the substrate's surface, the wings can be heated substantially uniformly over their surface. The heating by the heat dissipation from the circuit can also be tailored to specific parts of the wing to heat more the wing parts that need more heat to prevent ice buildup. Therefore, heat is used more efficiently and energy waste is reduced.

Solar Cells

According to an embodiment, molecular ink as described above can be used for the manufacture of solar cells and solar panels. Because of its high conductivity and high resolution capabilities, the molecular ink as described is particularly suitable for the printing of solar cells bus bars.

Conductive Films and Touch Interfaces

According to an embodiment, the molecular ink can be used to manufacture printed transparent conductive electrodes or transparent conductive films because of its high conductivity and high resolution capabilities. This transparent conductive film enables the manufacturing of printed capacitive micro-wire touch interfaces.

The advantage with this embodiment is the ability to design and build quickly custom prototypes of touch screens. For example, laser companies have developed an ITO laser etching process that enables capacitive touch screen manufacturing. This technology is based on laser ablation of an ITO film followed by bus bar printing and/or trimming. The embodiment described herein is rather based on printing silver electrodes grid or pattern on a flexible substrate, which if necessary could be followed by a laser ablation process to trim the printed traces and produce the capacitive interface. This is more efficient to design and build quickly custom prototypes of touch screens.

Another embodiment comprises performing a selective sintering of traces printed using the Ag molecular ink. This embodiment has the advantage to produce much more flexible.

Therefore, molecular ink can be advantageously used in a process where conductive traces produced by direct printing and laser trimming and/or printing and selective sintering of a molecular conductive ink are used to produce flexible or rigid micro-wire capacitive touch interfaces.

Hybrid Integration of Discrete Active Switches

This activity focused on heterogeneous integration platform of off-the-shelf discrete MMIC switch chip and flexible substrate enabled by screen printing. Combines traditional small-area low-power and high-performance System-on-Chip (SoC), flexible substrate and cost-effective Printed Electronics (FIGS. 17-24).

Proof of concept of the traditional system-on-chip and printed electronics combined in the hybrid system was developed that offer both their advantages. The preliminary measurement result indicates that printed electrodes have comparable performance with the commercial ones. The SoC and printed electronics based hybrid system offers a promising solution for the next generation of fully reconfigurable and adaptive engineered surfaces.

CPW Lines and Filters

Broadband Material Characterization of CPW Lines and Filters Implemented on Plastic Substrate (FIGS. 25-28).

Micro-Wires

Capacitive technology "Field coupled" with "printed Micro-wires" is shown in FIG. 29. It is a matter of printing a grid of conductive traces connected to one or more common traces in X and Y with a screen printing process. The width of the printed traces would be between 10 µM and 50 µM so that the conductivity and transparency of the device is acceptable.

Thermoforming High Temperature Molecular Silver Inks

It is demonstrated that the silver molecular inks can be photonically sintered on Kapton substrate to produce conductive traces sheet resistivity values of ~8.3 m$\Omega$/$\gamma$/mil$^7$. Photonic sintering is of interest because it enables the processing of traces in milliseconds as opposed to tens of minutes with thermal processing methods. Also it is demonstrated that photonic sintering enables processing of the molecular inks on low temperature substrates such as polyethylene terephthalate, polyethylene naphthalate, polycarbonate and glycol-modified polyethylene terephthalate (PETG). The ability to use IPL to process inks on PETG is valuable as it opens up the potential to investigate unique methods to produce in-mold electronic circuits. A potential advantage to using a combination of molecular inks and photonic sintering to produce in-mold electronics lies in the fact that the traces can be molded prior to being converted to conductive traces and subsequently converted to a conductive 3D trace using photonic energy. This not possible with silver flake inks, and is a unique process that can only be carried out using molecular inks.

In generating conductive 3D molded traces, it is important to first understand how the geometry of the features formed into the traces will impact the substrate, and more importantly, the traces printed onto the substrates. As summarized in FIG. 30, the average and maximum strain imparted on the substrate when oval and circular domes are formed into it are ~16% and 40%, respectively. When objects with more advanced geometries such as rectangular prisms with 55 to 75° off-of-vertical angles are formed into the substrate, the average and maximum strain imparted on the substrate can be as much as 40% and 75%, respectively. In addition, crater based objects with combinations of angled and rounded features also impart significant strain on the substrate. With knowledge of the strains imparted on the substrate following the thermoforming of the objects of interest, we next investigated how electrical properties of traces were affected through the thermoforming/photosintering process.

FIG. 30 illustrates the geometry of the objects used to mold 3D shapes into the PETG substrate and the measured strain imparted on the substrate as a result of the thermoforming process.

As highlighted in FIG. 31, the relative resistance increase (R/Ro) is less than 1.4 in comparison to unformed traces when molding oval and round dome features into the molecular ink traces. Also of note, the process of thermoforming the traces prior to producing conductive traces enables the generation of functional traces with linewidths as narrow as 160 μm. In expanding the scope of geometries, this process also enabled the generation of conductive 3D rectangular prism features into the silver traces. As highlighted in FIG. 31, the relative resistance increase for 160 to 550 μm features was also under 1.4 in comparison to unformed traces. This is particularly impressive considering the traces are under average strains of ~20-40% and experience maximum strains as high as 75% (FIG. 30). There are very few examples in the literature where highly conductive traces can be subjected to strains greater than 50% without significant decrease in electrical performance. Finally, crater structures that have both angled and rounded features were also molded into the traces. Though the average strain imparted on the traces is not as high as in the rectangular prisms, these structures are of interest because a large area of the trace is experiencing the strain (⅔ by area). Despite this significant area of the traces experiencing strain, the relative resistance increase for 160 to 550 μm features was between 1.5 and 2.8 in comparison to the unformed traces (FIG. 31).

FIG. 31 illustrates the relative resistance changes measured for the traces that have been printed onto PETG, thermoformed and photosintered to produce a conductive silver trace.

In conclusion, the ability to thermoform printed traces of the molecular ink prior to converting the ink into its metallic state enables the production narrow, molded traces with line widths as narrow as 164 μm linewidths formed into quite complex shapes and large areas of strain (⅔ of the traces formed over the traces experience strain) with excellent electrical properties.

While preferred embodiments have been described above and illustrated in the accompanying drawings, it will be evident to those skilled in the art that modifications may be made without departing from this disclosure. Such modifications are considered as possible variants comprised in the scope of the disclosure.

The invention claimed is:

1. An electronic device comprising a printed substrate comprising a trace of molecular ink thereon, the molecular ink being sintered to form a conductive metal trace forming the electronic device, wherein the molecular ink is chosen from:
   a) a flake-less printable composition of 30-60 wt % of a $C_8$-$C_{12}$ silver carboxylate, 0.1-10 wt % of a polymeric binder and balance of at least one organic solvent, all weights based on total weight of the composition; or
   b) a flake-less printable composition of 5-75 wt % of bis(2-ethyl-1-hexylamine) copper (II) formate, bis(octylamine) copper (II) formate or tris(octylamine) copper (II) formate, 0.25-10 wt % of a polymeric binder and balance of at least one organic solvent, all weights based on total weight of the composition,
   wherein the molecular ink is stretchable and thermoformable, and
   wherein the molecular ink is printed as an in-mold electronic device.

2. The electronic device of claim 1, wherein the electronic device comprises an inductor.

3. The electronic device of claim 1, wherein the electronic device comprises a capacitor.

4. The electronic device of claim 1, wherein the electronic device is printed as a solar cell.

5. The electronic device of claim 1, wherein the electronic device is printed as a transparent electrode.

6. The electronic device of claim 1, wherein the electronic device is printed as an electroluminescent lamp.

7. The electronic device of claim 1, wherein the electronic device is printed as a wearable electronic device.

8. The electronic device of claim 1, wherein the electronic device is printed as one of a physicochemical and an electromechanical sensor.

9. The electronic device of claim 1, wherein the electronic device is printed as an in-mold resistive electrical circuit.

10. The electronic device of claim 1, wherein the electronic device is installed on a portion of an aircraft.

11. The electronic device of claim 1, wherein the electronic device is installed on a wing of an aircraft to heat the wing.

12. The electronic device of claim 1, wherein the trace of molecular ink is stretchable and thermoformable.

13. The electronic device of claim 1, wherein the molecular ink is sintered to form the conductive metal trace with the conductive metal trace forming a part of the in-mold electronic device.

14. A heater comprising an electronic device comprising a printed substrate with a trace of molecular ink thereon, the molecular ink being sintered to form a conductive metal trace forming the electronic device, wherein the molecular ink is chosen from:
   a) a flake-less printable composition of 30-60 wt % of a $C_8$-$C_{12}$ silver carboxylate, 0.1-10 wt % of a polymeric binder and balance of at least one organic solvent, all weights based on total weight of the composition; or
   b) a flake-less printable composition of 5-75 wt % of bis(2-ethyl-1-hexylamine) copper (II) formate, bis(octylamine) copper (II) formate or tris(octylamine) copper (II) formate, 0.25-10 wt % of a polymeric binder and balance of at least one organic solvent, all weights based on total weight of the composition,
   wherein the trace of molecular ink is stretchable and thermoformable, and
   wherein the molecular ink is printed as an in-mold electronic device.

15. The heater of claim 14, wherein the molecular ink is sintered to form the conductive metal trace with the conductive metal trace forming a part of the in-mold electronic device.

16. A touch interface comprising a printed substrate comprising a trace of molecular ink thereon, the molecular ink being sintered to form a conductive metal trace forming a transparent conductive film, wherein the molecular ink is chosen from:
   a) a flake-less printable composition of 30-60 wt % of a $C_8$-$C_{12}$ silver carboxylate, 0.1-10 wt % of a polymeric binder and balance of at least one organic solvent, all weights based on total weight of the composition; or
   b) a flake-less printable composition of 5-75 wt % of bis(2-ethyl-1-hexylamine) copper (II) formate, bis(octylamine) copper (II) formate or tris(octylamine) copper (II) formate, 0.25-10 wt % of a polymeric binder and balance of at least one organic solvent, all weights based on total weight of the composition, wherein the trace of molecular ink is stretchable, thermoformable, and is able to undergo elongation greater than 50% without significant decrease in electric performance, and wherein the molecular ink is printed as an in-mold electronic device.

17. The touch interface of claim 16, further comprising printed capacitive or resistive elements.

18. The touch interface of claim 16, further comprising a capacitive micro-wire, wherein the capacitive micro-wire comprises a grid or pattern of printed silver electrodes and the substrate is flexible.

19. The touch interface of claim 16, wherein the molecular ink is sintered to form the conductive metal trace with the conductive metal trace forming a part of the in-mold electronic device.

\* \* \* \* \*